US007913706B2

(12) United States Patent
DeKraker et al.

(10) Patent No.: US 7,913,706 B2
(45) Date of Patent: Mar. 29, 2011

(54) RINSING METHODOLOGIES FOR BARRIER PLATE AND VENTURI CONTAINMENT SYSTEMS IN TOOLS USED TO PROCESS MICROELECTRONIC WORKPIECES WITH ONE OR MORE TREATMENT FLUIDS, AND RELATED APPARATUSES

(75) Inventors: David DeKraker, Burnsville, MN (US); Jimmy D. Collins, Allen, TX (US); Tracy A. Gast, Waconia, MN (US); Alan D. Rose, Wylie, TX (US); Richard E. Williamson, Chanhassen, MN (US)

(73) Assignee: FSI International, Inc., Chaska, MN (US)

( * ) Notice: Subject to any disclaimer, the term of this patent is extended or adjusted under 35 U.S.C. 154(b) by 215 days.

(21) Appl. No.: 12/220,887

(22) Filed: Jul. 29, 2008

(65) Prior Publication Data

US 2009/0038647 A1 Feb. 12, 2009

Related U.S. Application Data

(60) Provisional application No. 60/963,840, filed on Aug. 7, 2007.

(51) Int. Cl.
*B08B 3/04* (2006.01)
(52) U.S. Cl. ..................... 134/198; 134/104.1
(58) Field of Classification Search .............. 134/166 R, 134/171, 184
See application file for complete search history.

(56) References Cited

U.S. PATENT DOCUMENTS

| 3,990,462 A | 11/1976 | Elftmann et al. |
| 4,544,446 A | 10/1985 | Cady |
| 4,609,575 A | 9/1986 | Burkman |
| 4,682,615 A | 7/1987 | Burkman et al. |
| 4,801,335 A | 1/1989 | Burkman et al. |
| 4,903,717 A | 2/1990 | Sumnitsch |
| 5,020,323 A | 6/1991 | Hürlimann |
| 5,246,526 A | 9/1993 | Yamaguchi et al. |
| 5,271,774 A | 12/1993 | Leenaars et al. |

(Continued)

FOREIGN PATENT DOCUMENTS

EP 1 204 139 5/2002

(Continued)

OTHER PUBLICATIONS

Machine translation of 2004-031400.

(Continued)

*Primary Examiner* — Michael Kornakov
*Assistant Examiner* — Natasha Campbell
(74) *Attorney, Agent, or Firm* — Kagan Binder, PLLC

(57) ABSTRACT

Tool for treating microelectronic workpieces with one or more treatment materials, including liquids, gases, fluidized solids, dispersions, combinations of these, and the like. The invention provides an approach for rapid, efficient rinsing of wetted surface(s), and is particularly advantageous when used to rinse the lower surface of moveable barrier structures such as a barrier plate that overlies a workpiece being treated in such a manner to define a tapering flow channel over the workpiece. Rather than spray rinsing liquid onto the surface in a manner that generates undue splashing, droplet, or mist generation, the liquid is flowingly dispensed, preferably under laminar flow conditions, onto a surface that is in fluid communication with the surface to be rinsed. A smooth, uniform wetting and sheeting action results to accomplish rinsing with a significantly reduced risk of generating particle contamination.

10 Claims, 15 Drawing Sheets

U.S. PATENT DOCUMENTS

| | | | |
|---|---|---|---|
| 5,472,502 A | 12/1995 | Batchelder |
| 5,513,668 A | 5/1996 | Sumnitsch |
| 5,571,560 A | 11/1996 | Lin |
| 5,688,322 A | 11/1997 | Motoda et al. |
| 5,765,072 A | 6/1998 | Ohtani et al. |
| 5,783,025 A | 7/1998 | Hwang et al. |
| 5,785,068 A | 7/1998 | Sasaki et al. |
| 5,873,380 A | 2/1999 | Kanno |
| 5,900,059 A | 5/1999 | Shimanuki et al. |
| 5,916,366 A | 6/1999 | Ueyama et al. |
| 5,927,303 A | 7/1999 | Miya et al. |
| 6,048,409 A | 4/2000 | Kanno et al. |
| 6,051,371 A | 4/2000 | Mita et al. |
| 6,065,424 A | 5/2000 | Shacham-Diamand et al. |
| 6,090,205 A | 7/2000 | Sakai et al. |
| 6,096,233 A | 8/2000 | Taniyama et al. |
| 6,129,546 A | 10/2000 | Sada |
| 6,149,759 A | 11/2000 | Guggenberger |
| 6,221,781 B1 | 4/2001 | Siefering et al. |
| 6,230,722 B1 | 5/2001 | Mitsumori et al. |
| 6,239,038 B1 | 5/2001 | Wen |
| 6,243,966 B1 | 6/2001 | Lubomirsky et al. |
| 6,247,479 B1 | 6/2001 | Taniyama et al. |
| 6,260,562 B1 | 7/2001 | Morinishi et al. |
| 6,273,104 B1 | 8/2001 | Shinbara et al. |
| 6,299,804 B1 | 10/2001 | Domodossola et al. |
| 6,332,470 B1 | 12/2001 | Fishkin et al. |
| 6,385,863 B1 | 5/2002 | Kruwinus |
| 6,398,975 B1 | 6/2002 | Mertens et al. |
| 6,431,184 B1 | 8/2002 | Taniyama |
| 6,435,200 B1 | 8/2002 | Langen |
| 6,473,993 B1 | 11/2002 | Yagi et al. |
| 6,491,764 B2 | 12/2002 | Mertens et al. |
| 6,494,221 B1 | 12/2002 | Sellmer et al. |
| 6,536,454 B2 | 3/2003 | Lindner |
| 6,589,338 B1 | 7/2003 | Nakamori et al. |
| 6,594,847 B1 | 7/2003 | Krusell et al. |
| 6,672,318 B1 | 1/2004 | Tsuchiya et al. |
| 6,688,784 B1 | 2/2004 | Templeton |
| 6,694,224 B2 | 2/2004 | Ramanan |
| 6,705,331 B2 | 3/2004 | Sato et al. |
| 6,737,104 B2 | 5/2004 | Suzuki et al. |
| 6,810,888 B2 | 11/2004 | Tsuchiya et al. |
| 6,826,910 B1 | 12/2004 | Easton |
| 6,834,440 B2 | 12/2004 | Lee |
| 6,874,516 B2 | 4/2005 | Matsuno et al. |
| 6,901,938 B2 | 6/2005 | Sato et al. |
| 6,913,651 B2 | 7/2005 | Ivanov et al. |
| 7,022,193 B2 | 4/2006 | Jeong et al. |
| 7,051,743 B2 | 5/2006 | Kim et al. |
| 7,089,076 B2 | 8/2006 | Geismar et al. |
| 7,171,973 B2 | 2/2007 | Orii et al. |
| 7,275,553 B2 | 10/2007 | Orii et al. |
| 7,306,002 B2 | 12/2007 | Kim et al. |
| 7,309,847 B2 | 12/2007 | Cao |
| 7,323,080 B2 | 1/2008 | Kim et al. |
| 7,332,055 B2 | 2/2008 | Orii et al. |
| 7,364,625 B2 | 4/2008 | Christenson et al. |
| 7,383,843 B2 | 6/2008 | Ravkin et al. |
| 7,387,131 B2 | 6/2008 | Kuroda et al. |
| 7,389,783 B2 | 6/2008 | Woods et al. |
| 7,390,365 B2 | 6/2008 | Itoh et al. |
| 7,404,407 B2 | 7/2008 | Orii et al. |
| 7,422,641 B2 | 9/2008 | Nakajima et al. |
| 7,476,616 B2 | 1/2009 | Christenson |
| 7,531,039 B2 | 5/2009 | Sato et al. |
| 7,543,593 B2 | 6/2009 | Orii et al. |
| 7,584,760 B2 | 9/2009 | Miya et al. |
| 2002/0029788 A1 | 3/2002 | Verhaverbeke et al. |
| 2002/0063169 A1 | 5/2002 | Verhaverbeke et al. |
| 2002/0106269 A1 | 8/2002 | Nishimura et al. |
| 2003/0051366 A1 | 3/2003 | Ise et al. |
| 2003/0070695 A1 | 4/2003 | Emami et al. |
| 2003/0084925 A1 | 5/2003 | Nakajima et al. |
| 2003/0155325 A1 | 8/2003 | Mansour et al. |
| 2003/0170988 A1 | 9/2003 | Izumi et al. |
| 2003/0172955 A1 | 9/2003 | Kuroda et al. |
| 2003/0181040 A1 | 9/2003 | Ivanov et al. |
| 2003/0226577 A1 | 12/2003 | Orll et al. |
| 2004/0050491 A1 | 3/2004 | Miya et al. |
| 2004/0055707 A1 | 3/2004 | Sato et al. |
| 2004/0060190 A1 | 4/2004 | Lee |
| 2004/0062874 A1 | 4/2004 | Kim et al. |
| 2004/0079395 A1 | 4/2004 | Kim et al. |
| 2004/0079396 A1 | 4/2004 | Jeong et al. |
| 2004/0089328 A1 | 5/2004 | Sato et al. |
| 2004/0132318 A1 | 7/2004 | Kim et al. |
| 2004/0226655 A1 | 11/2004 | Kajino et al. |
| 2005/0244579 A1 | 11/2005 | Matsuzawa et al. |
| 2005/0263066 A1 | 12/2005 | Lubomirsky et al. |
| 2006/0128133 A1 | 6/2006 | Christenson |
| 2006/0219258 A1 | 10/2006 | Gast |
| 2006/0260647 A1 | 11/2006 | Verhaverbeke et al. |
| 2007/0012339 A1* | 1/2007 | Fukuda et al. ............... 134/26 |
| 2007/0022948 A1 | 2/2007 | Rose et al. |
| 2007/0105380 A1 | 5/2007 | Orii et al. |
| 2007/0158329 A1 | 7/2007 | Cao |
| 2007/0245954 A1 | 10/2007 | Collins et al. |
| 2008/0006303 A1 | 1/2008 | Butterbaugh et al. |
| 2008/0008834 A1 | 1/2008 | Collins et al. |
| 2008/0210278 A1 | 9/2008 | Orii et al. |
| 2008/0213076 A1 | 9/2008 | Hanson et al. |
| 2008/0271763 A1 | 11/2008 | Collins et al. |
| 2008/0283090 A1 | 11/2008 | DeKraker et al. |
| 2009/0038647 A1 | 2/2009 | DeKraker et al. |
| 2009/0280235 A1 | 11/2009 | Lauerhaas et al. |

FOREIGN PATENT DOCUMENTS

| | | |
|---|---|---|
| EP | 1 335 412 | 8/2003 |
| EP | 1 708 252 | 10/2006 |
| JP | 63073626 | 4/1988 |
| JP | 8-139065 A | 5/1996 |
| JP | 8139065 | 5/1996 |
| JP | 2000124181 | 4/2000 |
| JP | 2001267278 | 9/2001 |
| JP | 2002343711 | 11/2002 |
| JP | 2003109935 | 4/2003 |
| JP | 2004-031400 | 1/2004 |
| JP | 2004-153078 | 5/2004 |
| JP | 2004265912 | 9/2004 |
| JP | 2005235945 | 9/2005 |
| WO | WO 03/030228 | 4/2003 |
| WO | WO 2004/001828 | 12/2003 |
| WO | WO 2004/070807 | 8/2004 |
| WO | WO 2004/093166 | 10/2004 |
| WO | WO 2006/107549 | 10/2006 |
| WO | WO 2006/107550 | 10/2006 |
| WO | WO 2008/029848 | 3/2008 |

OTHER PUBLICATIONS

Machine translation of 2004-153078.
Lim, Jung-Soo, "The 6th Surface Cleaning Users Group Meeting, Cleaning Technology Symposium," handout, Sep. 19, 2007 (9 pages).
Adjustable Flow Air Amplifiers, http://www.airtxinternational.com/catalog/air_amplifiers.php?gclid=CMHsm_ix551CF QE . . . (3 pages).
Air Amplifier—Nex Flow™, http://www.process-controls.com/techsales/Nex_Flow/air_amplifier.htm (3 pages).

* cited by examiner

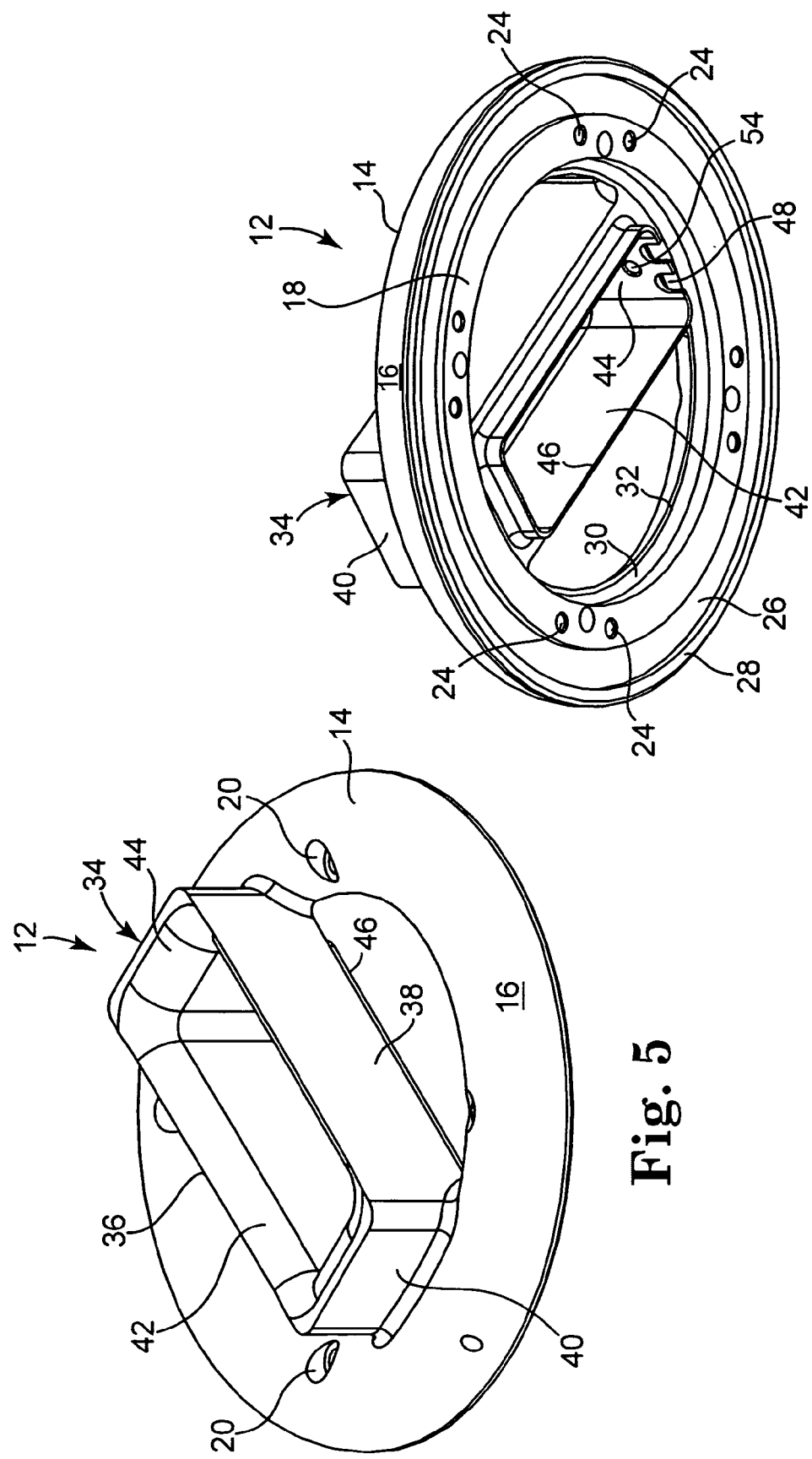

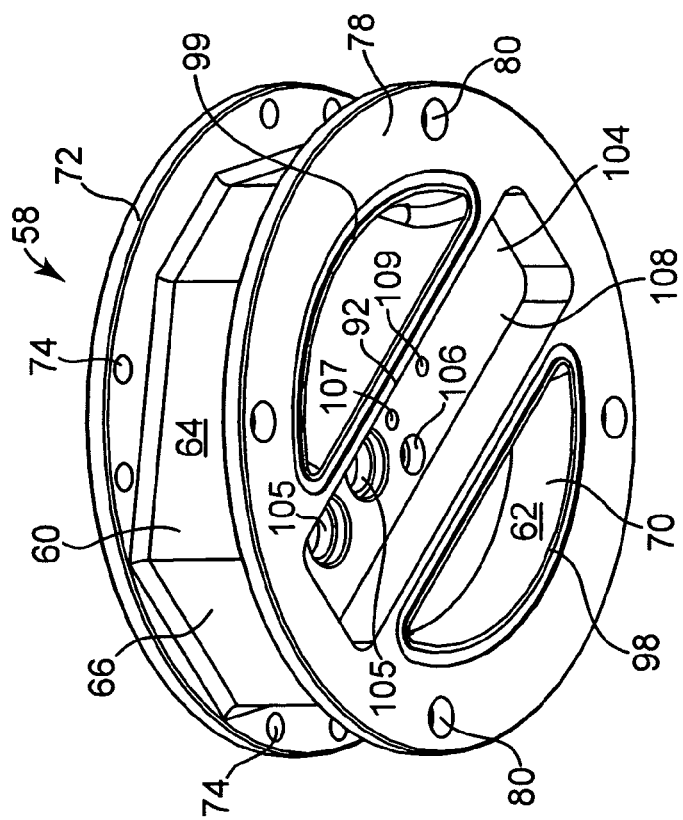
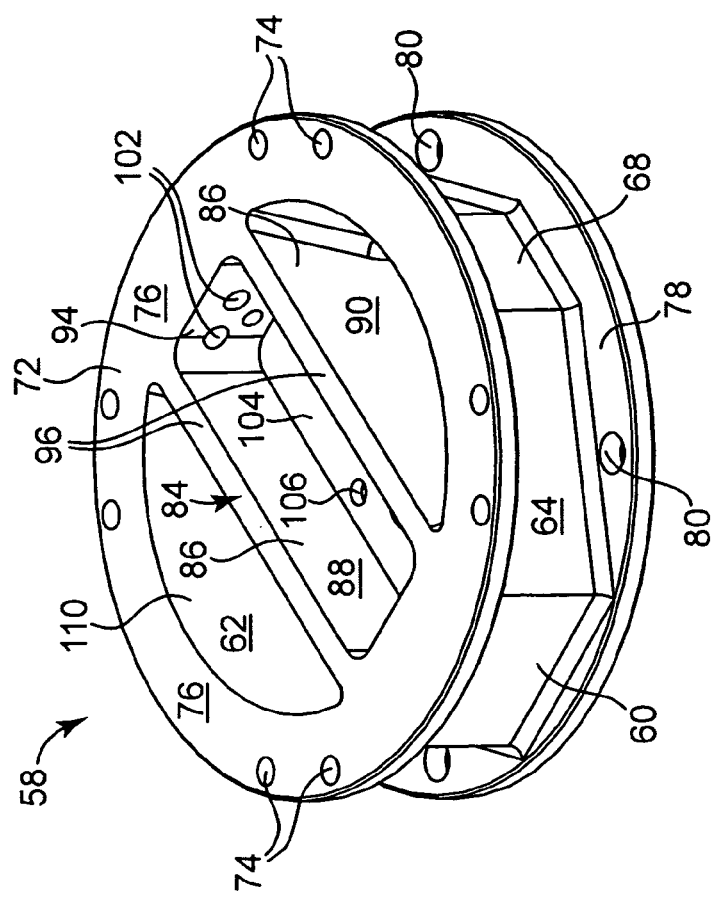

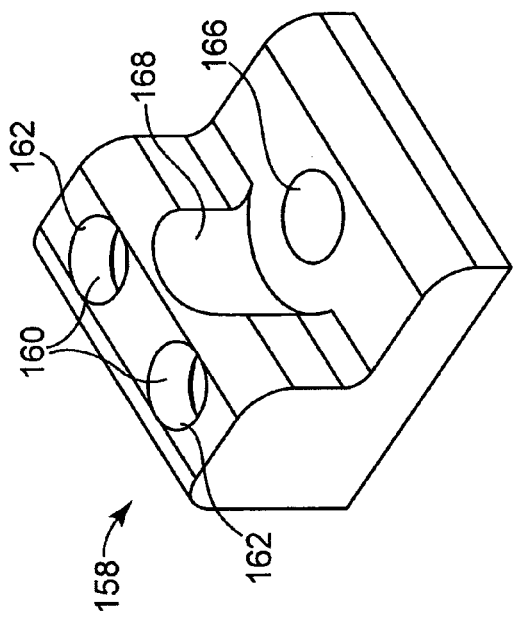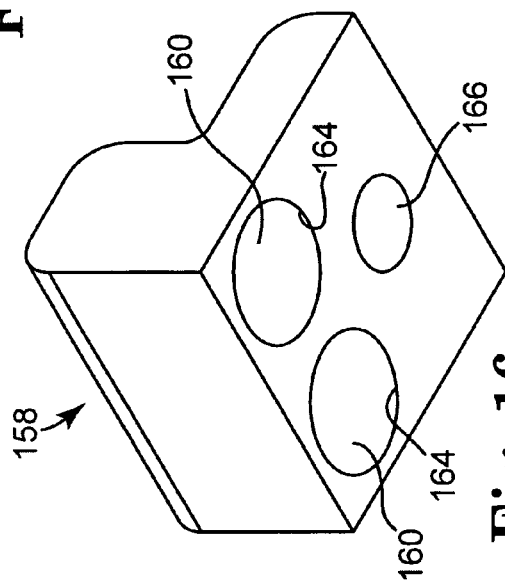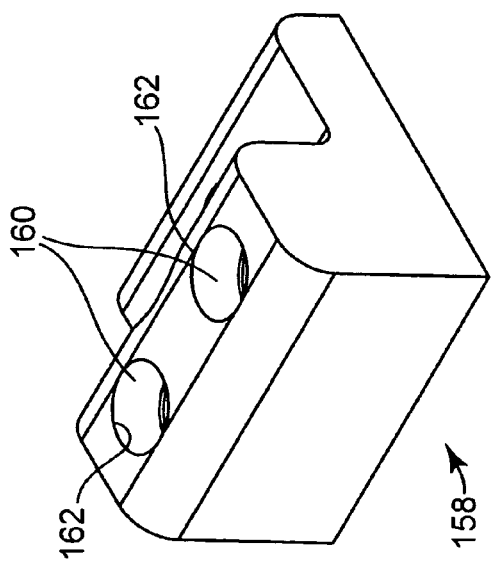

RINSING METHODOLOGIES FOR BARRIER PLATE AND VENTURI CONTAINMENT SYSTEMS IN TOOLS USED TO PROCESS MICROELECTRONIC WORKPIECES WITH ONE OR MORE TREATMENT FLUIDS, AND RELATED APPARATUSES

PRIORITY

The present nonprovisional patent application claims priority under 35 USC §119(e) from United States Provisional Patent Application having Ser. No. 60/963,840, filed on Aug. 7, 2007, by DeKraker et al., and titled RINSING METHODOLOGIES FOR BARRIER PLATE AND VENTURI CONTAINMENT SYSTEMS IN TOOLS USED TO PROCESS MICROELECTRONIC WORKPIECES WITH ONE OR MORE TREATMENT FLUIDS, wherein said provisional application is incorporated herein by reference in its entirety.

FIELD OF THE INVENTION

The present invention relates to barrier plates, venturi containment strategies, and dispense assemblies for tools used to process microelectronic substrates with one or more treatment fluids, including liquids and/or gases. More particularly, the present invention relates to such tools with improved rinsing capabilities with respect to the surfaces of the barrier plates and/or venturi-shaped containment pathways.

BACKGROUND OF THE INVENTION

The microelectronic industry relies on a variety of different processes to manufacture microelectronic devices. Many processes involve a sequence of treatments in which different kinds of treatment fluids are caused to contact the workpiece in accordance with desired recipes. These fluids may be liquids, gases, or combinations thereof. In some treatments, solids may be suspended or dissolved in a liquid or entrained in a gas.

Innovative tools for processing microelectronic workpieces are described in Assignee's co-pending U.S. patent application now published as U.S. Patent Publication No. US-2007/0022948-A1 (hereinafter referred to as the Co-Pending Application No. 1); Assignee's co-pending U.S. patent application having Ser. No. 11/376,996, titled BARRIER STRUCTURE AND NOZZLE DEVICE FOR USE IN TOOLS USED TO PROCESS MICROELECTRONIC WORKPIECES WITH ONE OR MORE TREATMENT FLUIDS, in the names of Collins et al., filed Mar. 15, 2006, (hereinafter referred to as the Co-Pending Application No. 2) and being a counterpart to PCT published application WO 2006/107550; and Assignee's Co-Pending Application having Ser. No. 11/820,709 titled BARRIER STRUCTURE AND NOZZLE DEVICE FOR USE IN TOOLS USED TO PROCESS MICROELECTRONIC WORKPIECES WITH ONE OR MORE TREATMENT FLUIDS, in the names of Collins et al., filed Jun. 20, 2007, (hereinafter referred to as Co-Pending Application No. 3). The entireties of these co-pending U.S. patent applications and these publications are incorporated herein by reference for all purposes.

The "processing section 11" of the co-pending U.S. patent applications advantageously includes nested duct features that allow one or more duct pathways to be selectively opened and closed. For example, when the structures are moved apart relatively, a duct pathway opens and is enlarged between the structures. When the structures are moved together relatively, the duct between the structures is choked and is reduced in size. In preferred embodiments, multiple ducts can exist in the same volume of space depending upon how the moveable duct structures are positioned. Thus, multiple ducts can occupy a volume minimally larger than the volume occupied by only a single duct. The ducts are used to capture various treatment fluids, including liquid and/or gases, for recycling, discarding, or other handling. Different treatment fluids can be recovered in different, independent ducts to minimize cross-contamination and/or to use unique capture protocols for different fluids. Because of the nested character of the duct structures, the duct system also is extremely compact.

These co-pending U.S. patent applications also describe an innovative spray nozzle/barrier structure. This structure includes capabilities for dispensing treatment materials in multiple ways such as by a spray, a center dispense, and a showerhead. The barrier structure overlies the underlying workpiece. The lower surface of the barrier structure is shaped in preferred embodiments so that it defines a tapering flow channel over the workpiece. This approach offers many benefits. The tapering flow channel helps to promote radial flow outward from the center of the workpiece while minimizing recirculation zones. The taper also helps to smoothly converge and increase the velocity of flowing fluids approaching the outer edge of the workpiece. This helps to reduce liquid splash effects. The angle of the lower surface also helps liquid on the lower surface to drain toward the outer periphery. The tapering configuration also helps to reduce recirculation of particles back onto the workpiece. The configuration also helps facilitate chemical reclaim efficiency by better containment of fluids.

Notwithstanding all these benefits, further improvements are still desired. Firstly, during the course of treating a workpiece, the lower surface of the barrier structure may bear drops or films of liquid(s) used during the treatment and/or as a result of rinsing the barrier structure. For example, Assignee's Co-Pending Application No. 3 describes a rinsing strategy in which rinse tubes are led downward through a chimney leading into a process chamber, wherein the chimney provides a path of egress into the process chamber generally through a central region of the barrier structure. The rinse tubes extend into the process chamber so that their lower ends are generally at the same height as the lower surface of the barrier structure. A rinsing liquid is sprayed onto the lower surface through nozzles attached to the ends of the tubes.

While this strategy effectively rinses the barrier structure, the resultant spray has a tendency to splash when impacting the barrier structure. This can generate droplets or mists that, in turn, can lead to particle contamination. The alignment and spray pattern of the nozzles with the lower surface of the barrier structure can be difficult to set or maintain to match the geometry of the barrier structure. The tubes and nozzles can collect moisture, which can drip and cause contamination. The tubes and nozzles can also obstruct and/or disrupt the flow of liquids and gases into the process chamber. Improved rinsing methodologies are therefore desired.

SUMMARY OF THE INVENTION

The present invention provides a tool for treating microelectronic workpieces with one or more treatment materials, including liquids, gases, fluidized solids, dispersions, combinations of these, and the like. The invention provides an approach for rapid, efficient rinsing of wetted surface(s), and is particularly advantageous when used to rinse the lower surface of moveable barrier structures such as a barrier plate that overlies a workpiece being treated in such a manner to define a tapering flow channel over the workpiece. Rather than spray rinsing liquid onto the surface in a manner that generates undue splashing, droplet, or mist generation, the liquid is flowingly dispensed or poured, preferably under laminar flow conditions, onto a surface that is in fluid communication with the surface to be rinsed. A smooth, uniform wetting and sheeting action results to accomplish rinsing with a significantly reduced risk of generating particle contamination. In representative embodiments, the orifices through which the liquid is dispensed are in close proximity to the target surface, e.g., within 0.1 to 20, more desirably 0.1 to 5 mm, and even 1 mm from the target surface.

Additionally, embodiments of the present invention may incorporate a nozzle pattern that promotes very comprehensive wetting and smooth sheeting action of the lower barrier structure surface with less formation of discrete channels, dripping, or other problems that could lead to contamination. In these embodiments, the nozzle array(s) include at least one of, preferably two of, and more preferably all three of a variable spacing, varying nozzle size, and varying nozzle angle with respect to the surface targeted by the nozzles. A representative array of nozzles has variable spacing between nozzles and has two or more nozzles whose compound angle differs relative to one or more other nozzles in the array. Further, embodiments of the present invention may incorporate a pre-wetting strategy that promotes very comprehensive wetting and smooth sheeting action of the lower barrier structure surface with less of formation of discreet channels, dripping, or other problems that could lead to contamination.

According to one aspect of the present invention, a method of rinsing an apparatus includes the steps of a) providing an apparatus that includes a process chamber in which at least one microelectronic workpiece can be positioned during a treatment and a barrier structure that includes a lower surface that overlies and at least partially covers a workpiece when provided for treatment, and b) flowingly dispensing a liquid onto the barrier structure under conditions so that the liquid forms a sheet and then wets the lower surface of the barrier structure.

According to another aspect of the present invention, a method of rinsing an apparatus includes the steps of a) providing an apparatus that includes a process chamber in which at least one microelectronic workpiece can be positioned during a treatment, a barrier structure that includes a lower surface that overlies and at least partially covers a workpiece when provided for treatment, and an additional surface that is fluidly coupled to the lower surface, and b) flowingly dispensing a flow of a liquid onto said additional surface under conditions such that a sheet of the liquid forms and flows onto and wets the lower surface of the barrier structure.

According to another aspect of the present invention, an apparatus for processing at least one microelectronic workpiece includes a) a process chamber in which the at least one microelectronic workpiece can be positioned during a treatment, b) a barrier structure that includes a lower surface that overlies and at least partially covers a workpiece when provided for treatment, c) an additional surface that is fluidly coupled to the lower surface of the barrier structure, and d) a plurality of nozzles aimed at and positioned sufficiently close to the additional surface to flowingly dispense a liquid onto said additional surface.

According to another aspect of the present invention, an apparatus for processing at least one microelectronic workpiece includes a) a process chamber in which the at least one microelectronic workpiece can be positioned during a treatment, b) a barrier structure including a lower structure that overlies and at least partially covers a workpiece when provided for treatment, c) a venturi-shaped pathway providing an egress into the process chamber, said pathway including a pathway surface that is fluidly coupled to the lower surface of the barrier structure, and d) at least one nozzle positioned in the pathway and aimed to dispense a liquid onto the pathway surface.

According to another aspect of the present invention, a method of rinsing an apparatus includes the steps of a) providing an apparatus that includes a process chamber in which at least one microelectronic workpiece can be positioned during a treatment, a barrier structure that includes a lower surface that overlies and at least partially covers a workpiece when provided for treatment, and an additional surface that is fluidly coupled to the lower surface, and b) prewetting the lower surface of the barrier structure and optionally the additional surface, and c) after pre-wetting, flowingly dispensing a liquid onto said additional surface under conditions such that the liquid forms a sheet on said additional surface and then sheets onto and wets the lower surface of the barrier structure.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein:

FIG. 5 is a perspective view of the top member incorporated into the air intake assembly of FIG. 1 looking generally downward onto the top of the top member.

FIG. 6 is a perspective view of the top member incorporated into the air intake assembly of FIG. 1 looking generally upward toward the bottom of the top member.

FIG. 7 is a perspective view of the base member incorporated into the air intake assembly of FIG. 1 looking generally downward onto the top of the base member.

FIG. 8 is a perspective view of the base member incorporated into the air intake assembly of FIG. 1 looking generally upward toward the bottom of the base member.

FIG. 14 is a perspective view of the retaining clamp used in the air intake assembly of FIG. 1.

FIG. 15 is an alternative perspective view of the retaining clamp used in the air intake assembly of FIG. 1.

FIG. 16 is another alternative perspective view of the retaining clamp used in the air intake assembly of FIG. 1.

DETAILED DESCRIPTION OF PRESENTLY PREFERRED EMBODIMENTS

Figure 1:
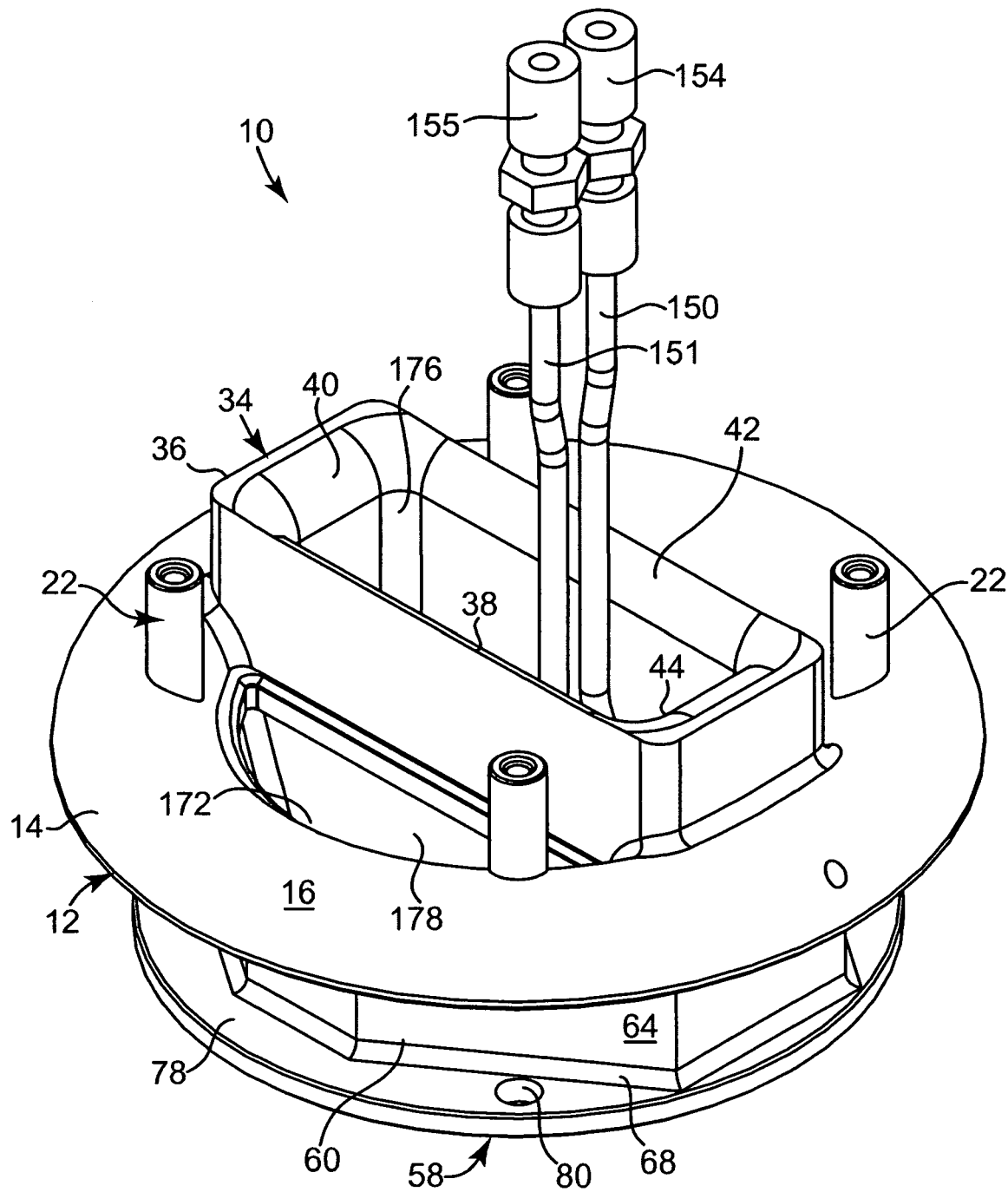
FIG. 1 is a perspective view of an air intake assembly of the present invention looking generally down onto the top of the assembly.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. While the present invention will be described in the specific context of fluid based microelectronic substrate cleaning systems, the principles of the invention are applicable to other microelectronic processing systems as well.

In the following discussion, if a recited feature and its reference numeral are both included in quotes, the recitation refers to a feature and reference numeral described and shown in Assignee's Co-Pending Application No. 3. If no quotes are used, the recitation refers to a feature and reference numeral of the present invention which will be shown in the accompanying Figures in addition to being described herein.

A particularly preferred embodiment of an air intake assembly 10 with rinsing capabilities of the present invention is shown in FIGS. 1 through 16, and 18A through 18I. This particular embodiment is designed to be used in the "barrier/dispense section 14" described in Assignee's Co-Pending Application No. 3. Air intake assembly 10 of the present invention along with standoff supports depicted herein may be substituted for the "air intake flange 338", "showerhead spacer 382", "standoff supports 380", "rinse tubes 504", and "rinse tube nozzles 508". Air intake assembly 10 as shown in FIGS. 1 through 16, and 18A through 18I is designed to mount onto "barrier plate 102" as well as over "spray bar 178" and "center dispense nozzle assembly 518" in the same manner that "air intake flange 338" would have been coupled to these components. As another point of similarity, the "showerhead dispense member 426" mounts onto the air intake assembly 10, with helpful securement and support provided by standoffs 22 in the same way that the "showerhead dispense member 426" would have been mounted to the "showerhead spacer 382" and "standoff supports 380" of the prior design. Additionally, air intake assembly 10 includes features that allow suitable plumbing to be led to the rinsing features of air intake assembly 10 itself, the one or more dispensing component(s) to be included in the resultant barrier/dispensing section, and the aspirating elements of "barrier plate 102".

However, as compared to "rinse tubes 504" and "rinse tube nozzles 508", the upgraded air intake assembly 10 integrates improved rinsing capabilities that more effectively rinse and wet the "barrier plate 102" as well as the venturi containment system integrated into the assembly 10 while generating de minimis, if any, splashing and droplets that could lead to particle contamination. As another optional difference, features corresponding to "showerhead spacer 382" are integrated into air intake assembly 10 as integral features rather than being incorporated as a separate component as was the "showerhead spacer 382".

Air intake assembly 10 generally includes as main components a top member 12, a base member 58, and a rinsing member 114 clamped between the top member 12 and the base member 58. Top member 12 is best shown in FIGS. 1 through 6. Top member 12 includes a generally annularly shaped body 14 having a smoothly curved top surface 16 and a generally flat bottom 18. As will be described further below, the top surface 16 helps to define respective inlets 178 to venturi shaped pathways 172. The top member 12 includes apertures 20 for mounting standoffs 22 that will be used, in turn, to help mount and support the "showerhead dispense member 426". For purposes of illustration, four apertures 20 are shown for mounting four, corresponding standoffs 22, but a greater or lesser number may be used, as desired. The standoffs 22 may be secured to top member 12 via these apertures 20 in any desired fashion including via glue, welds, screws, through bolts, or the like. In some embodiments, male threads on the standoffs 22 may threadably engage corresponding female threads formed in the apertures 20.

Bottom 18 includes annular groove 26 proximal to the outer periphery 28 of bottom 18 provided for weight savings. Bottom 18 is also provided with an annular rabbet 30 on the inner periphery 32 in order to form a suitably sized pocket for clamping rinsing member 114 in position when the components of air intake assembly 10 are assembled. Bottom 18 is also provided with a plurality of threaded apertures 24 which provide a secure way to attach top member 12 to base member 58 with screws. The use of screws facilitates easy disassembly of air intake assembly 10 for maintenance and repair. Of course, other assembly techniques such as glue, welds, bolts, clamps, tape, combinations of these, and/or the like may be used. For purposes of illustration, four pairs of threaded apertures 24 are shown, although a greater or lesser number of these threaded apertures may be used if desired.

In addition to annular-shaped body 14, top member 12 also includes top spacer element portion 34. Top spacer element portion 34 extends from one side of body 14 to the other and serves multiple functions. Firstly, along with standoffs 22, the top spacer element portion 34 helps to mount and support the "showerhead dispense member 426". Additionally, the interior volume of top spacer element portion 34 helps to define a pathway 176 through which plumbing, electrical lines, fiber optics, sensors, and other tool componentry may be led while being isolated from the venturi pathways on the exterior of the top spacer element portion 34. Further, the top spacer element portion 34 also helps to define the inlets 178 and top portion of the venturi-shaped pathways 172 through which gases may be introduced into a processing chamber (not shown in FIGS. 1-16, and 18A-18I) with excellent containment capabilities. The top spacer element portion 34 also helps to reinforce and strengthen top member 12.

In more detail, top spacer element portion 34 includes top rim 36, sides 38, 40, 42, and 44, and bottom rim 46. One side 44 includes a pocket 48 to make room for plumbing connections to supply rinsing or other fluid to the rinsing member 114. Bottom rim 46 includes a rabbet 52. Similar to rabbet 30 of the top member 12, rabbet 52 is also sized to fit the rinsing member 114. The rinsing member 114 is held in this rabbet 52 and clamped in place when top member 12 and base member 58 are secured together. Side 44 also includes an aperture 54 (see FIG. 6) that is used to help secure retaining clamp 158 (See FIGS. 3, 4, and 14-16), described further below.

Top member 12 may be formed from a wide variety of materials that may be hydrophilic and/or hydrophobic. It is desirable in some embodiments to fabricate top member 12 from a hydrophobic material such as the TEFLON-branded fluoropolymer.

Base member 58 is best shown in FIGS. 1-3, 7, and 8. Base member 58 generally includes body 60, top flange 72, bottom flange 78, and bottom spacer element portion 84. Body 60 includes inner wall 62 and outer wall 64 that extend from top end 66 to bottom end 68. Inner wall 62 is contoured so that body 60 includes thickened wall portion 70 intermediate between top end 66 and bottom end 68. Thickened wall portion 70 helps to provide the throat region 174 of the venturi pathways 172. Outer wall 64 is faceted to help provide access to assembly hardware and for weight savings.

Top flange 72 extends outward from top end 66 and is generally annular in shape. Top flange 72 includes through apertures 74 that match the apertures 24 in top member 12 for attaching base member 58 to top member 12 via screws 25. Top face 76 of top flange 72 is generally flat to match the contour of bottom 18 of top member 12. In alternative embodiments, top face 76 and bottom 18 can have engaging contours that are not flat if desired. For instance, grooves, protuberances, undulations, or other features may be provided to assist with alignment during assembly. Optionally, a gasket (not shown) may be interposed between top face 76 and bottom 18.

Bottom flange 78 extends outward from bottom end 68 and also is generally annular in shape. Bottom flange 78 includes through apertures 80 for securing air intake assembly to the barrier plate 260 shown in FIG. 17, which preferably has the features as described with respect to "barrier plate 102" in Assignee's Co-Pending Application No. 3. The region of base member 58 proximal to the juncture between bottom end 68 and bottom flange 78 is shaped to provide a smooth transition between the inner wall 62 of body 60 to the lower surface of the barrier plate, promoting a smooth flow of fluid into and through the processing chamber 206 shown in FIG. 17.

Bottom spacer element portion 84 extends from one side of body 60 to the other and serves multiple functions. Firstly, along with standoffs 22 and the top spacer element portion 34, the bottom spacer element portion 84 helps to support the "showerhead dispense member 426" indirectly by providing support for the top spacer element portion 34. Additionally, the bottom spacer element portion 84 helps to define the pathway 176 through which plumbing, electrical lines, fiber optics, sensors, and other tool componentry may be led. Further, the bottom spacer element portion 84 also helps to define the outlets 180 and bottom portions of the venturi-shaped pathways 172, including the throat regions 174, through which gases may be introduced into the processing chamber 206 with excellent containment capabilities. The bottom spacer element portion 84 also helps to reinforce and strengthen base member 58. Bottom spacer element portion 84 also includes apertures to accommodate plumbing components and mounting components, as described further below.

In more detail, bottom spacer element portion 84 includes sidewalls 86 having inner faces 88, outer faces 90, bottom faces 92, end walls 94, and top faces 96. Bottom spacer element portion 84 also includes floor 104. Top faces 96 fit securely against bottom rim 46 to help clamp rinsing member 114 in position when base member 58 and top member 12 are secured together. Outside faces 90 help to define the venturi-shaped pathways 172, while inside faces 88 help to define the pathway 176.

Apertures 102 in one of the end walls 94 provide egress to and from pathway 176 for components entering and leaving the bottom of pathway 176 near floor 104. For instance, vacuum tubing (not shown) can be lead down through pathway 176 and then out to the aspirating features of "barrier plate 102" as described in Assignee's Co-Pending Application No. 3. Optionally, supply lines (not shown) for supplying rinsing fluid to rinsing member 114 might also be fed through apertures 102, although it is more preferred to install such rinse supply lines as shown in the Figures and described below.

Figure 2:
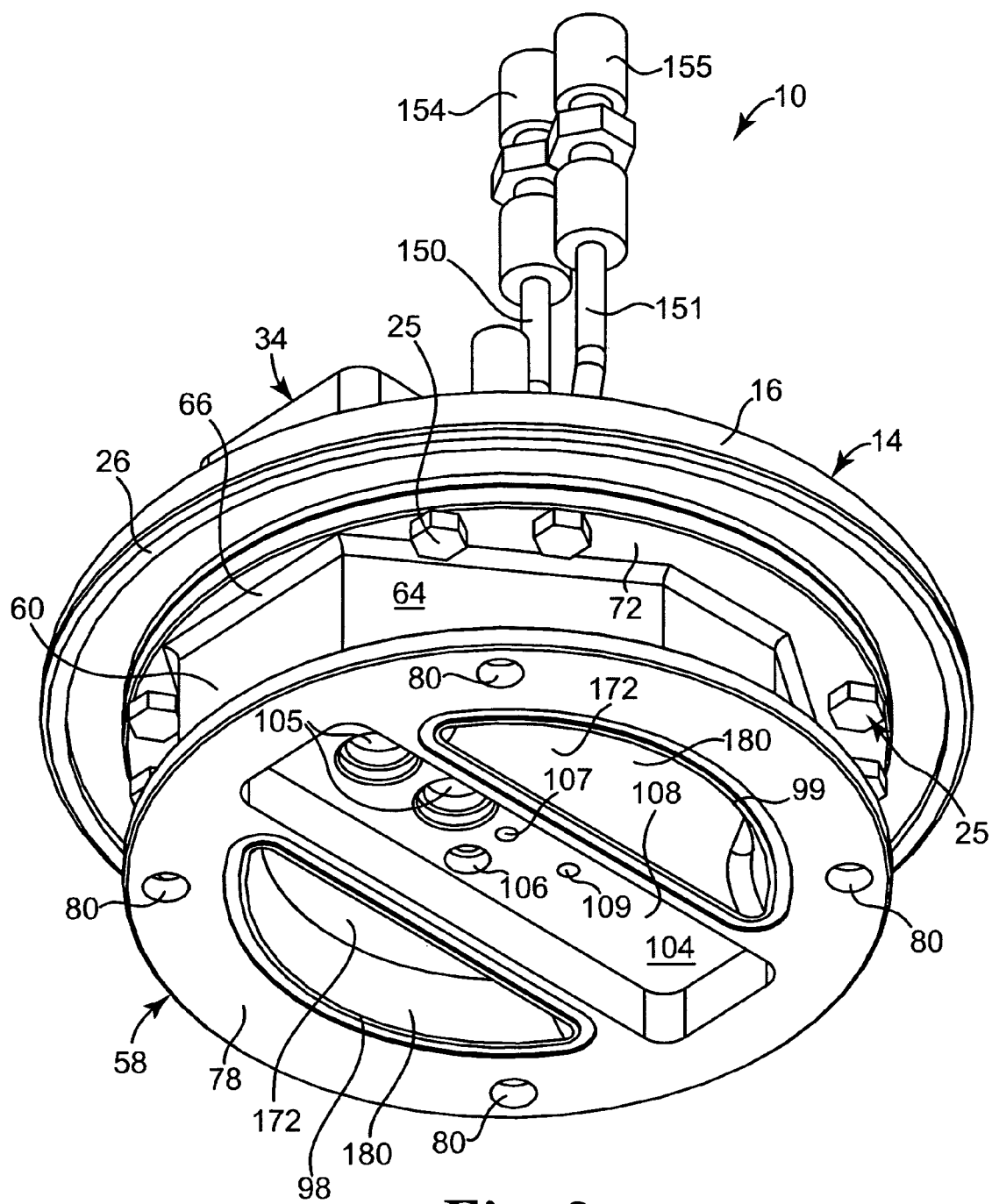
FIG. 2 is a perspective view of the air intake assembly of FIG. 1 looking generally up at the bottom of the assembly.
Figure 3:
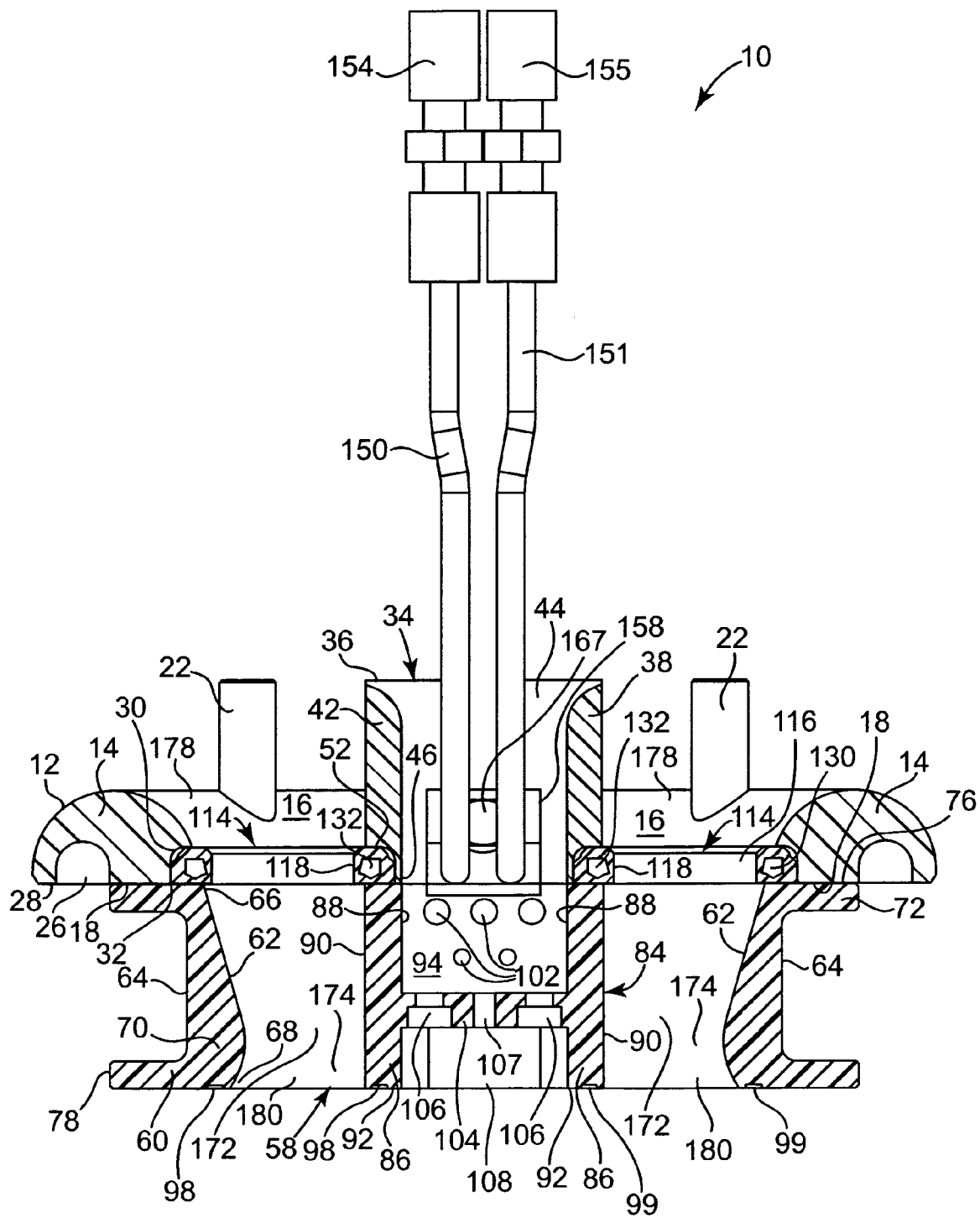
FIG. 3 is a cross-sectional view of the air intake assembly of FIG. 1.
Figure 4:
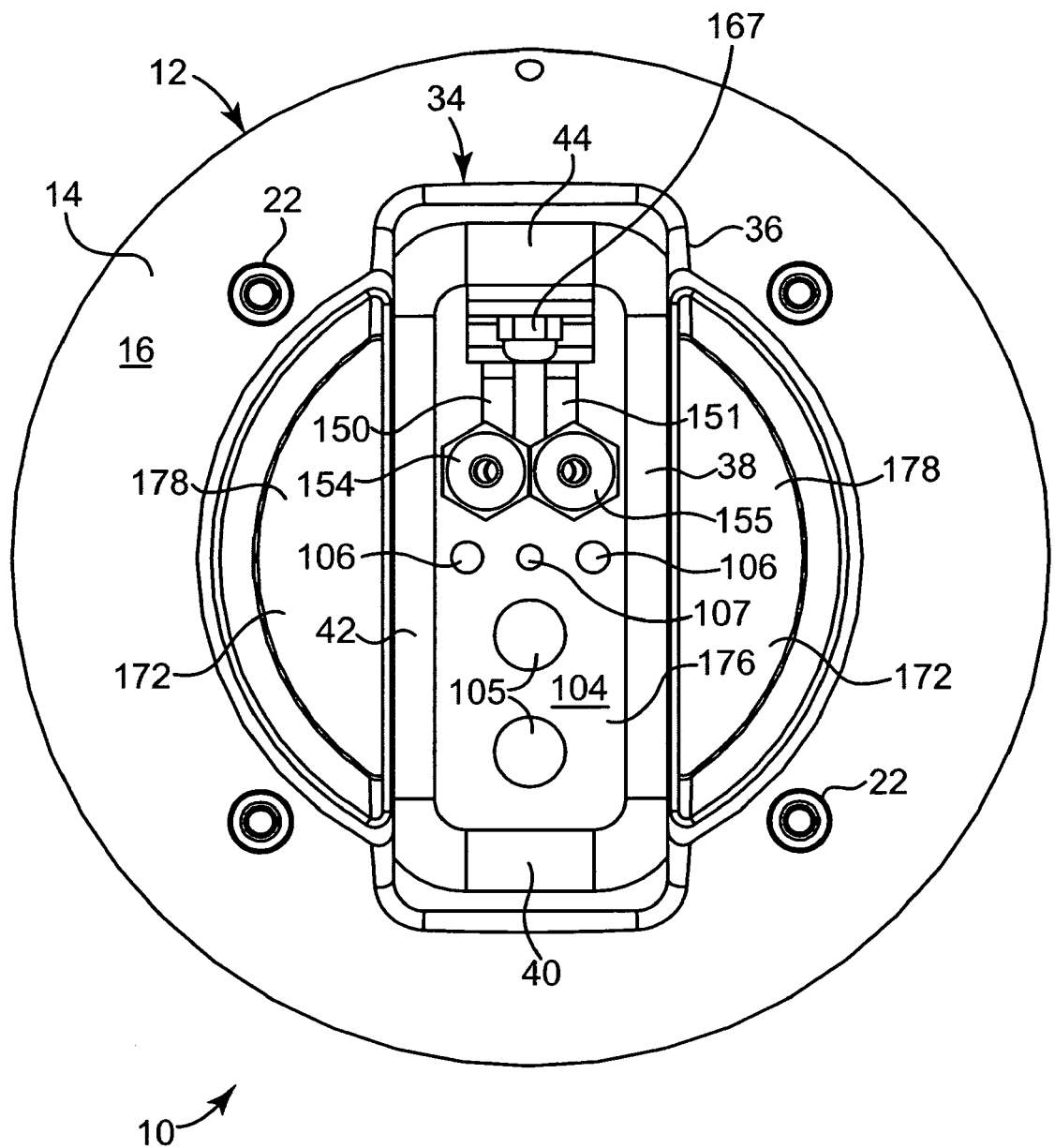
FIG. 4 is a top view of the air intake assembly of FIG. 1.

As seen best in FIGS. 2, 3 and 8, floor 104 is recessed relative to bottom faces 92 to define a pocket 108. This pocket 108 fits over and accommodates dispensing components when the air intake assembly 10 is mounted in position onto the barrier plate 260 of FIG. 17. To this end, floor 104 includes apertures 105 that fit over plumbing connections that couple supply lines (not shown) to the spray bar 280 of FIG. 17. Apertures 106 accommodate plumbing connections to the center dispense nozzle assembly 282, while aperture 107 accommodates mounting the center dispense nozzle assembly 282 to floor 104. Aperture 109 provides an accommodation for attaching air intake assembly to the spray bar 280. This attachment along with the attachments through apertures 80 in bottom flange 78 of base member 58 help hold air intake assembly 10 securely in place. Grooves 98 and 99 help position and hold gaskets (not shown) that help provide a fluid-tight seal between the air intake assembly and the underlying barrier structure (such as barrier plate 260 shown in FIG. 17).

To facilitate uniform wetting of the base member 58 during rinsing operations when using a rinsing liquid such as DI (deionized) water, it is desirable to fabricate base member from hydrophilic material(s). One example of a suitable hydrophilic material can be obtained by irradiating polyphenylene sulfide (PPS), generally a hydrophobic material, with a suitable dosage of ionizing radiation such as ultraviolet radiation, electron beam radiation, or the like. The PPS often has a light yellow color as supplied. A suitable dosage of radiation modifies the color of the PPS to be yellowish-brown without unduly compromising the physical properties of the PPS. Often, the color change is a visual indicator that the surface has been rendered hydrophilic. A simple empirical test can be done by pouring water onto the treated material to see if the water beads up or sheets out. In some instances, a color change may be observed and yet the surface remains hydrophobic. The material can be retreated with the ionizing energy one or more times until the surface becomes hydrophilic.

Figure 12:
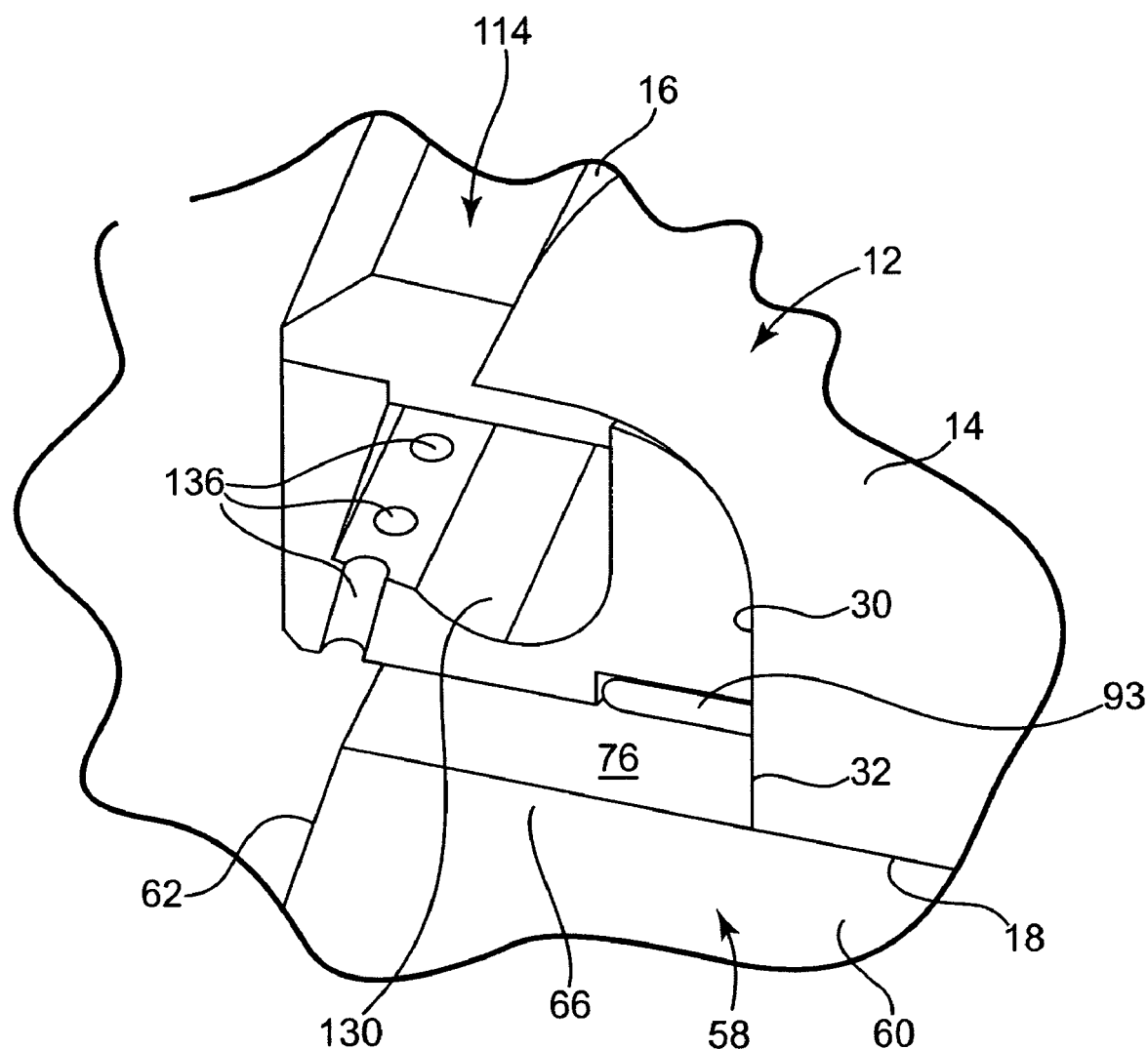
FIG. 12 is a close up, cross-sectional view of the air intake assembly of FIG. 1 showing the ring shaped body of the rinsing member clamped between the top member and the base member.
Figure 13:
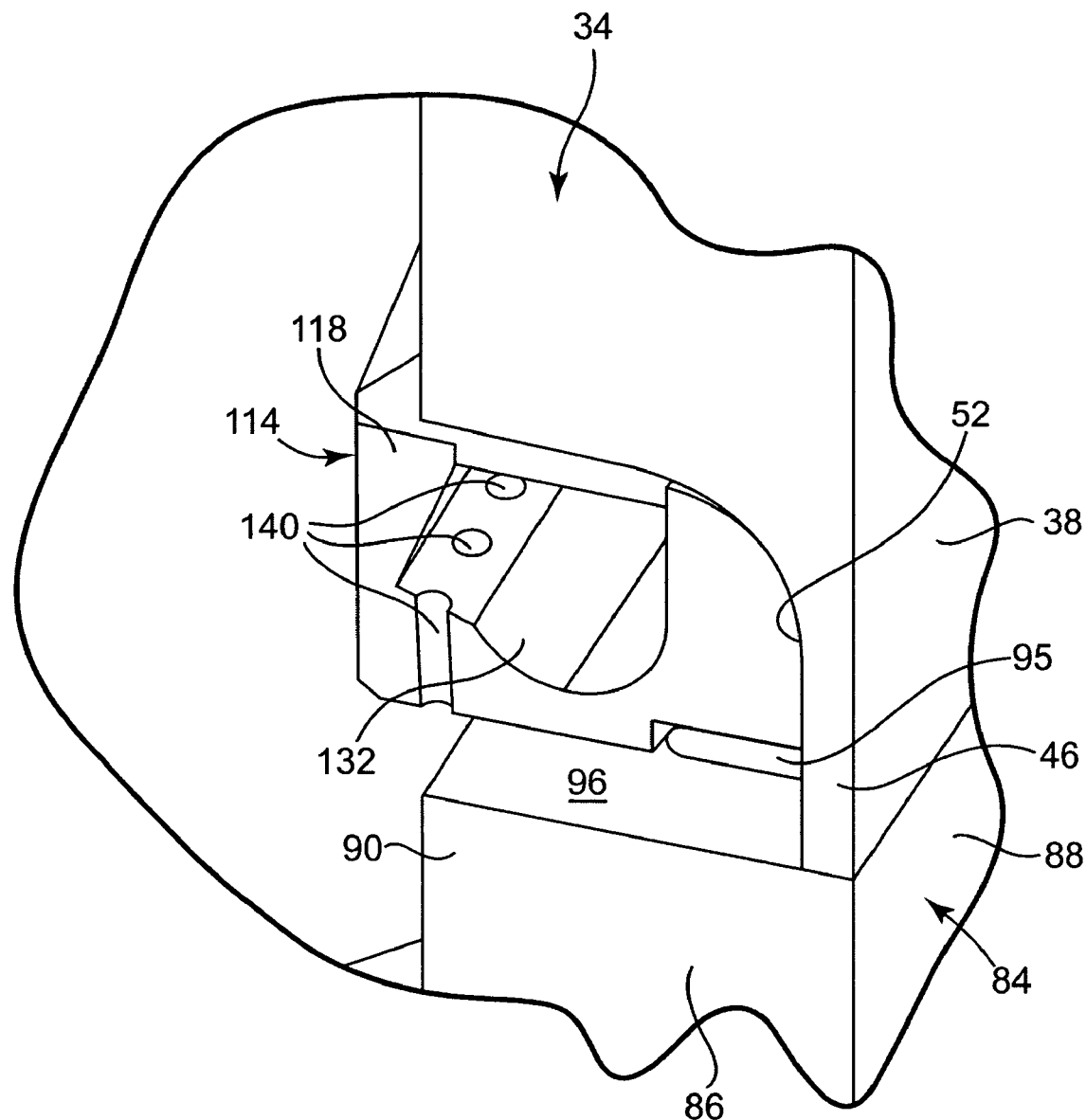
FIG. 13 is a close up, cross-sectional view of the air intake assembly of FIG. 1 showing an arm of the rinsing member clamped between the top and bottom spacer element portions

The rinsing member 114 is shown best in FIGS. 1, 3, 9-13, and 18A-18I. Rinsing member 114 generally includes a ring-shaped body 116 sized to fit within the rabbets 30 and 52 when top member 12 and base member 58 are clamped together. A pair of arms 118 extend from one side of ring-shaped body 116 to the other. The resultant structure of rinsing member 114 defines apertures 124, 126, and 128 corresponding to venturi pathways 172 and central pathway 176, respectively, in the assembled air intake assembly 10. It is preferable that the components of the air intake assembly 10 are assembled so as to effectively create a sealed structure, and as such, appropriate gasketing material or sealant can be utilized at appropriate interfaces, as such materials and techniques themselves are well-known. For example as shown in FIGS. 12 and 13, gaskets 93 and 95 are preferably used between the rinsing member 114 and faces 76 and 96 of the base unit 58 and the spacer element portion 84, respectively.

Rinsing member 114 includes fluid distribution features that allow rinsing liquid or other fluids to be introduced to the rinsing member 114 and then controllably dispensed from the rinsing member 114 so as to rinse the base member walls that form the venturi pathways 172 and the lower surface of the barrier plate 260. To this end, ring-shaped body 116 includes an internal passageway that defines a fluid distribution conduit 130 that extends desirably around at least a portion of the full circumference of body 116. Each arm 118 also preferably includes an internal passageway defining a fluid distribution conduit 132, respectively. At the ends of the arms 118, these conduits 132 can be in open fluid communication with the conduit 130 to create a common delivery manifold. Associated with each aperture 124 and 126 corresponding to venturi pathways 172, an array 136 of dispensing nozzles is provided on a portion of ring-shaped body 116 on the opposite side of venturi pathway 172 from an arm 118. The nozzles of each array 136, and in particular the outlet orifices of each opening are oriented to dispense fluid directly or indirectly onto inner wall 62 of body 60 of base member 58. Additional arrays 140 of dispensing nozzles are also preferably provided on each arm 118 on the opposite side of venturi pathway 172. These nozzles are oriented to dispense fluid directly or indirectly onto the outside faces 90 of bottom spacer element portion 84. As illustrated in FIGS. 12 and 13, the rinsing member 114 provides rinsing fluid directly to the surfaces of the inner wall 62 and faces 90; however, other components or surfaces thereof could be operatively positioned between the rinsing member 114 and the surfaces 62 and 90. Preferably a controlled flow of fluid is delivered to the surfaces 62 and 90 as described in greater detail below.

The embodiment of air intake assembly 10 shown in the Figures is configured so that the arm conduits 132 are in open fluid communication with the ring conduit 130. In other embodiments, the arm conduits 132 may be independent and, hence, fluidly isolated from the conduit 130. Each arm conduit 132 may also be independent from the other arm conduit 132. This allows rinse liquid to be independently supplied to each conduit so that the flow rate of liquid introduced to each conduit may be customized in a manner more optimally suited for the surfaces serviced by each array. For instance, a higher flow of rinse liquid can be supplied to the arrays 136 than is supplied to the arrays 140 to recognize that more liquid is needed to wet the lower surface of the barrier structure than is needed to wet the surfaces serviced by arrays 140.

Figure 10:
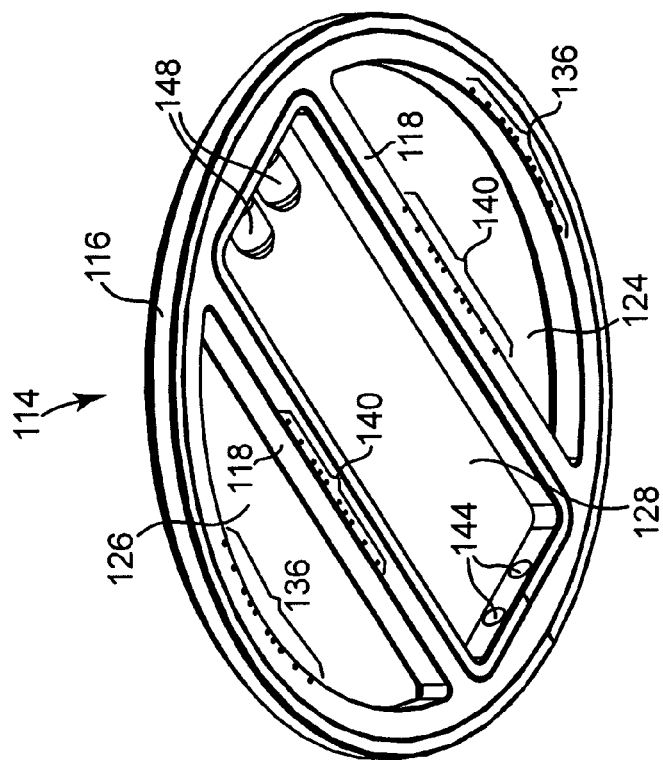
FIG. 10 is a perspective view of the rinsing member incorporated into the air intake assembly of FIG. 1 looking generally upward at the bottom of the rinsing member, wherein the nozzle arrays are visible.

As seen best in FIG. 10, the arrays 136 and 140 only span a portion of the ring-shaped body 116 and arms 118, respectively. In other embodiments, a greater or lesser number of nozzles may be used. In one mode of practice it was found that good rinsing action is achieved by using arrays 136 that each include ten nozzles that are variably spaced apart by between 2 mm to 6 mm, center to center, and having an orifice size of 0.79 mm and by using other arrays 140 that each includes ten nozzles spaced apart by between 2 mm to 6 mm, center to center, and having an orifice size of 0.61 mm.

The nozzle arrays 136 and 140 may have a variety of nozzle patterns. The passageways defining the nozzles can be parallel or nonparallel to each other, parallel or nonparallel to vertical, variably sized, variably spaced, combinations of these, and the like. The passageways themselves as defining the nozzles need not be linear, but it is important that the nozzles provide a controlled and directed fluid flow to achieve desired wetting results. To help promote smooth, uniform wetting and sheeting of liquid dispensed from the arrays 136 and 140, it has been found that nozzles patterns including variably angled and variably positioned nozzles provide better wetting characteristics. In particular, nozzle patterns incorporating one or more inclining angles and/or diverging angles are preferred. As used throughout the subject application, vertical refers to the normal direction of gravity as such would act on an assembled and operatively supported air intake assembly 10 as provided with a processing chamber in its operative position. As shown in FIG. 3, for example, surfaces 90 are shown to extend in a vertical manner. Also, inclining angles are considered as the angle of a surface or passageway as compared to vertical. Diverging angles are considered as the angle of a surface or passageway as compared to a vertically oriented plane that is provided bisecting the rinsing member 114, as shown, into symmetrical halves, hereinafter a "bisecting vertical plane."

Figure 18A:
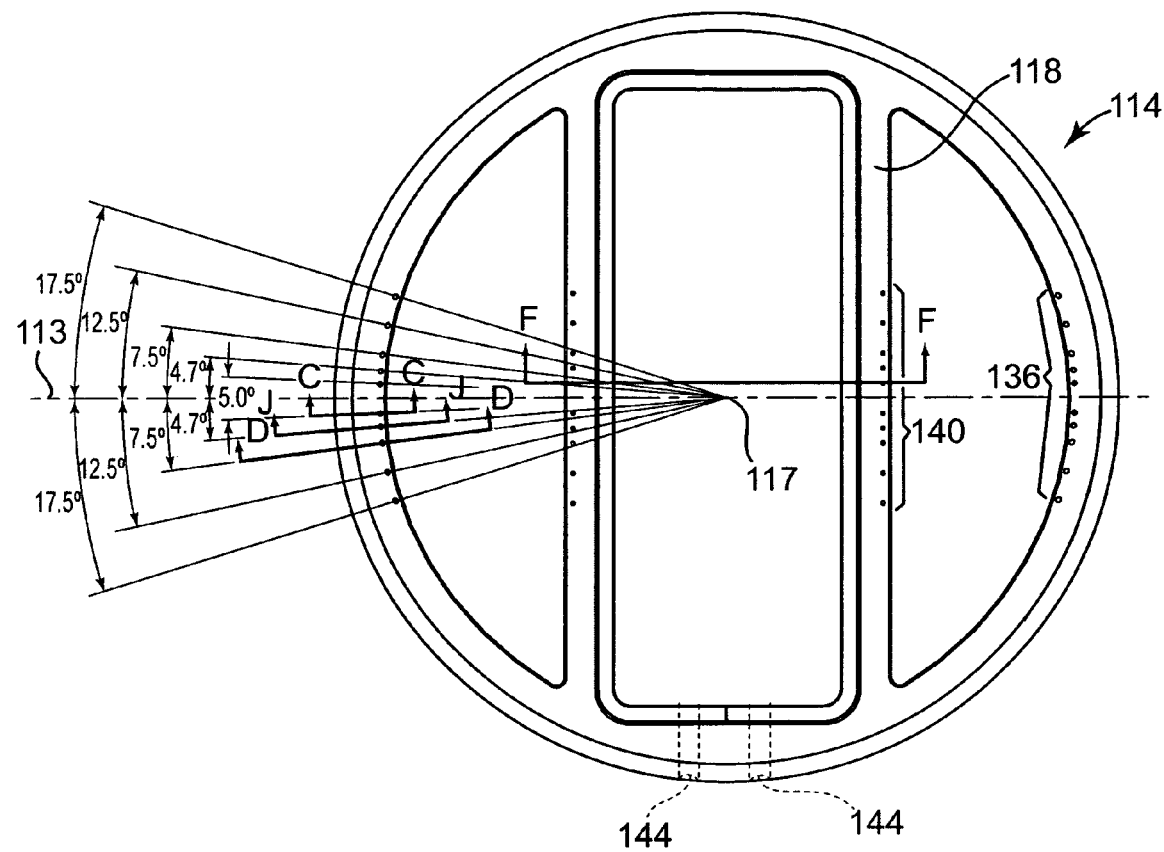
FIG. 18A is a view of the bottom of the rinsing member of FIG. 9.

For instance, FIGS. 18A-18I show particularly preferred embodiments of nozzle patterns for the nozzle arrays 136 and 140 in which the nozzle patterns are aimed at a plurality of different, compound angles relative to vertical 131 and the bisecting vertical plane 135. Vertical plane 135 passes through reference line 113, which is shown in FIG. 18A. FIG. 18A is a bottom view of the rinsing member 114.

Figure 9:
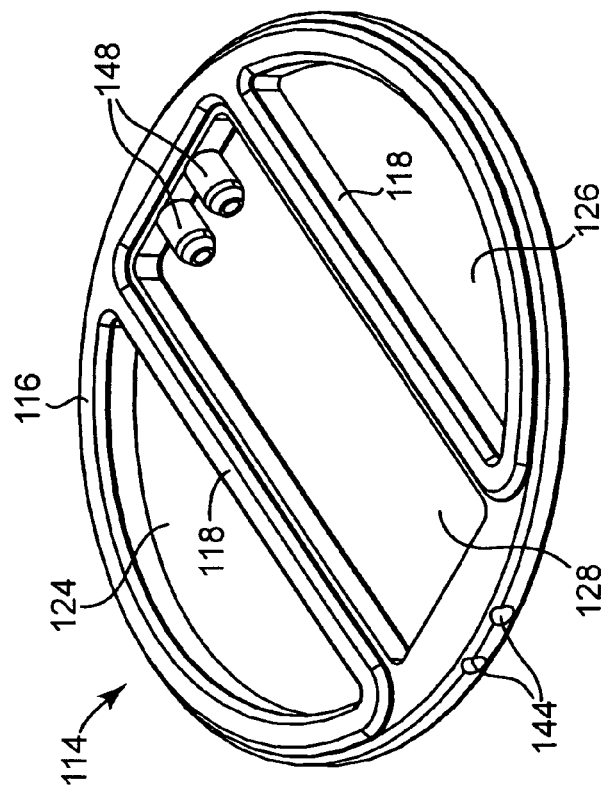
FIG. 9 is a perspective view of the rinsing member incorporated into the air intake assembly of FIG. 1 looking generally downward onto the top of the rinsing member.
Figure 11:
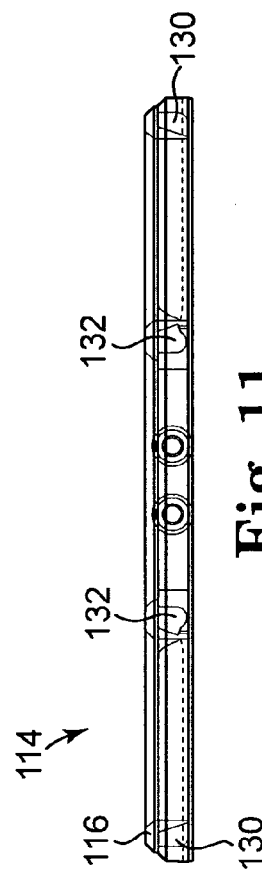
FIG. 11 is a side view of the rinsing member shown in FIG. 9.
Figure 18B:
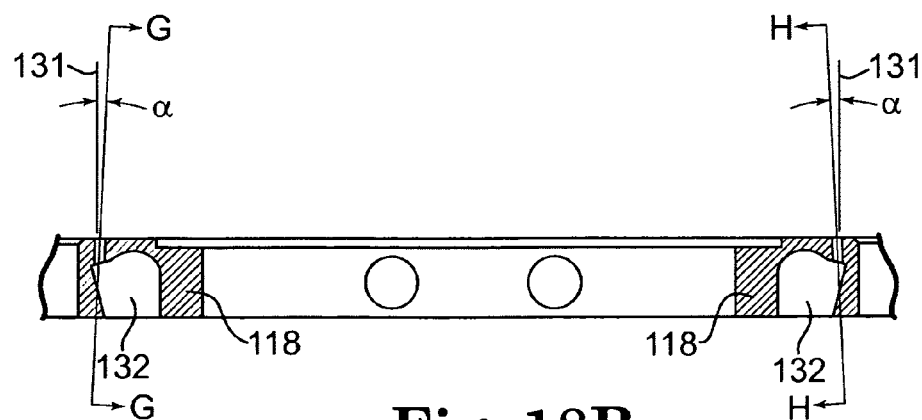
FIG. 18B is a cross-sectional view taken across the labeled section F-F of the rinsing member of FIG. 18A.
Figure 18C:
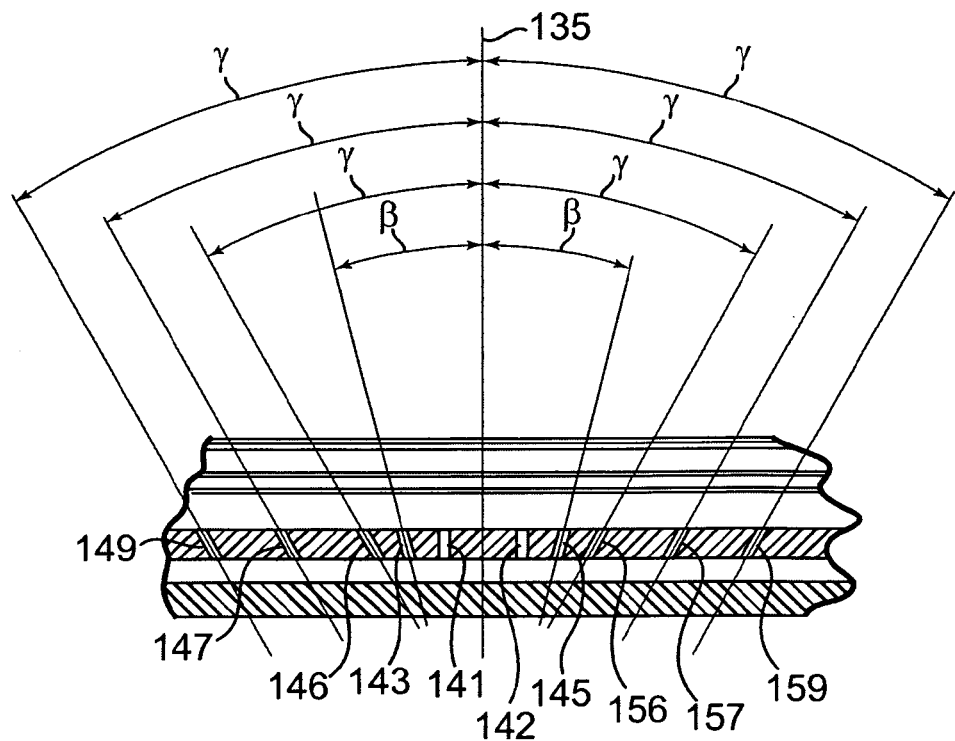
FIG. 18C is a cross-sectional view taken across the labeled section G-G of the view shown in FIG. 18B.
Figure 18D:
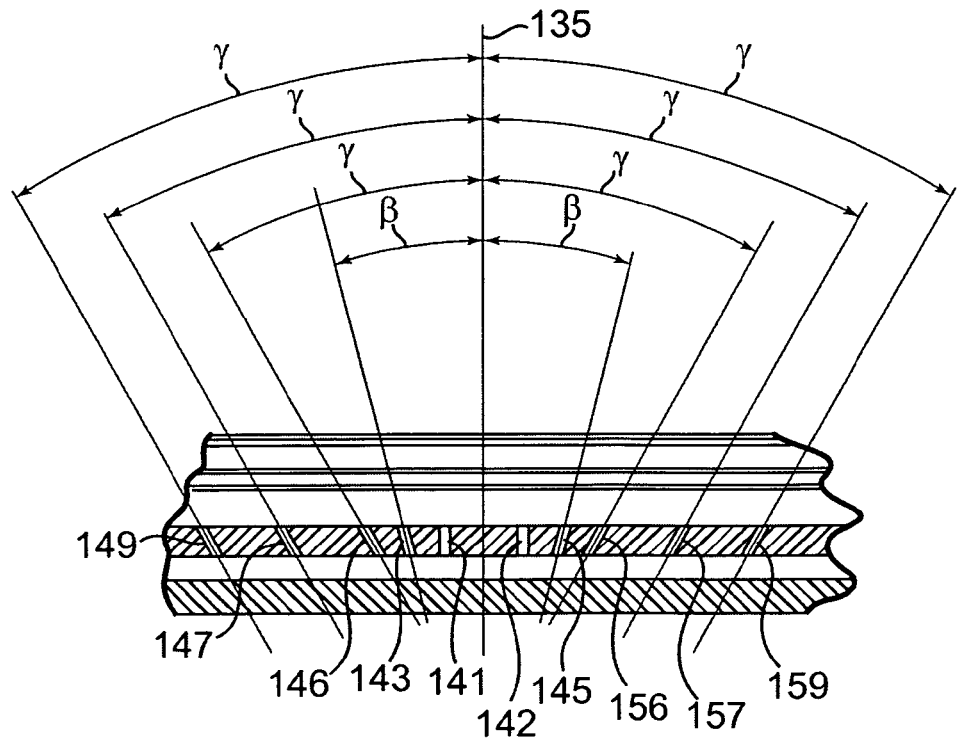
FIG. 18D is a cross-sectional view taken across the labeled section H-H of the view shown in FIG. 18B.

FIGS. 18B-18D includes three views of the rinsing member 114 of FIG. 9 that illustrate the compound angles (inclining angle and diverging angle) and variable spacing as such features are incorporated into the illustrated nozzle arrays 140 of each arm 118 of the rinsing member 114. The use of this kind of pattern helps to provide a smooth, uniform wetting of the target surfaces and then of the lower surface of the barrier structure as coupled to the target surfaces.

The view labeled section F-F in FIG. 18B is a cross-section taken across the arms 118 to show how the nozzles of the array 140 can be directed toward the center of the rinsing member 114, and hence would be aimed, or inclined from vertical 131 toward the target surfaces. The illustrative inclining angle $\alpha$ shown in this view is 4 degrees relative to vertical 131, which inclining angle $\alpha$ is preferably the same for all the nozzles in array 140.

Figure 18E:
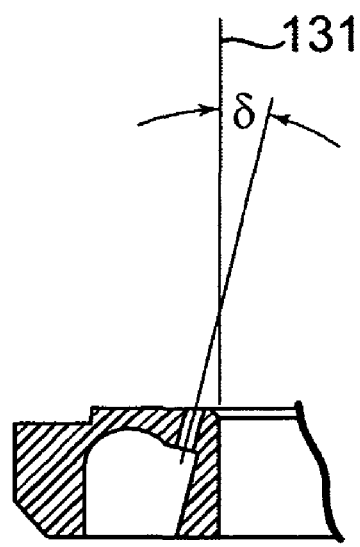
FIG. 18E is a cross-sectional view taken across the labeled section C-C of the rinsing member of FIG. 18A.
Figure 18F:
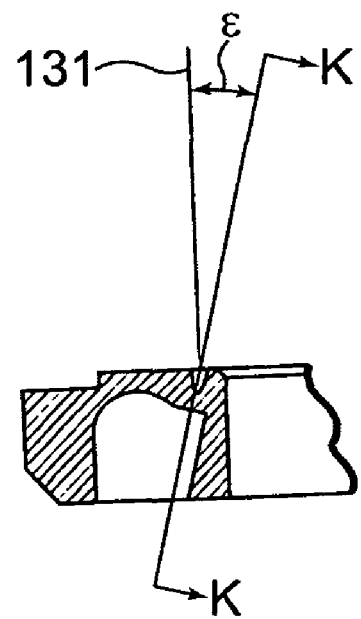
FIG. 18F is a cross-sectional view taken across the labeled section J-J of the rinsing member of FIG. 18A.
Figure 18G:
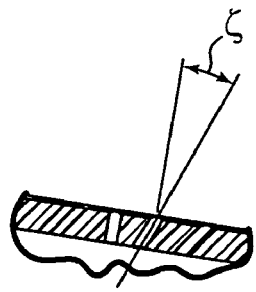
FIG. 18G is a cross-sectional view taken across the labeled section K-K of the view shown in FIG. 18F.
Figure 18H:
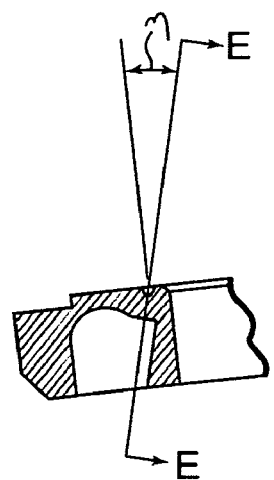
FIG. 18H is a cross-sectional view taken across the labeled section D-D of the rinsing member of FIG. 18A.
Figure 18I:
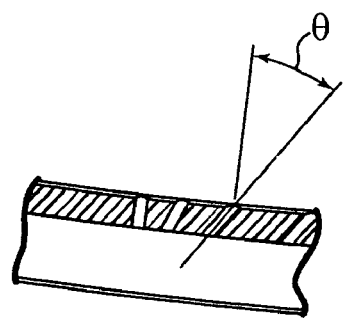
FIG. 18I is a cross-sectional view taken across the labeled section E-E of the view shown in FIG. 18H.

The views labeled section G-G and H-H in FIGS. 18C and 18D, respectively, are cross-sections taken along the length of each arm 118 to show how the diverging angles of the nozzles with respect to vertical and the bisecting vertical plane 135 are preferably variable and diverging away from the bisecting vertical plane 135. Bisecting vertical plane 135 is perpendicular relative to the outlet face of each arm 118. The views in FIGS. 18C and 18D show that the two centrally located nozzles 141 and 142 of each array 140 generally have an inclining angle of 0 degrees. The next pair of nozzles 143 and 145 in the illustrated embodiment that are located outboard from each of these centrally located nozzles 141 and 142 has a diverging angle $\beta$ of 15 degrees. The next three pairs of outboard nozzles 146, 147, 149, 156, 157, and 159, in the illustrated embodiment each have a diverging angle $\gamma$ of 30 degrees. The views-labeled section G-G and H-H in FIGS. 18C and 18D, respectively, also show that the spacing in the illustrated embodiment between the nozzle outlets (and inlets) is variable as well. FIGS. 18E-18I illustrate 5 views of the rinsing member 114 of FIG. 9 that illustrate the inclining and diverging nozzle patterns incorporated into the nozzle arrays 136. FIG. 18E is the view labeled section C-C and shows the inclining angle $\delta$ of the nozzles associated with line C-C. For each array 136, the nozzles associated with line C-C correspond to the two centrally located nozzles of the array 136. The view labeled section C-C shows that these nozzle pairs of each array 136 in the illustrated embodiment have an inclining angle δ of 12 degrees with respect to vertical 131. Although not shown in FIG. 18E, the nozzles associated with line C-C have a diverging angle of 0 degrees with respect to the nozzle's radial position and the bisecting vertical plane. FIGS. 18F and 18G are the views labeled sections J-J and K-K, respectively, and show the inclining angle ϵ and diverging angle ζ, respectively, of the pair of nozzles of each array 136 in the illustrated embodiment that are associated with the line J-J. The pair of nozzles of each array 136 that are associated with the line J-J are the two nozzles outboard from each of the centrally located nozzles in the illustrated embodiment. FIGS. 18F and 18G show that the nozzles associated with sections J-J have an inclining angle ϵ of 13 degrees and a diverging angle ζ of 20 degrees. FIGS. 18H and 18I are the views labeled Section D-D and Section E-E, respectively, and show the inclining angle η and diverging angle θ, respectively, of the remainder of the nozzles of arrays 136 in the illustrated embodiment, which are associated with the line D-D. These nozzles have an inclining angle η of 13 degrees and a diverging angle θ of 35 degrees.

The bottom view of rinsing member 114 shown in FIG. 18A also shows the radial positioning of the nozzles in arrays 136 relative to the center 117 of the ring-shaped body 116. Using a horizontal diameter through center 117 as the 0 degree reference line 113, the nozzle pairs of the arrays 136 are radially positioned 2.5 degrees (a total of 5 degrees apart), 4.7 degrees, 7.5 degrees, 12.5 degrees, and 17.5 degrees from the reference line 113.

The rinsing member 114 is expected to dispense mainly water as a rinsing liquid, and can be made from hydrophobic and/or hydrophilic materials. In one embodiment, the rinsing member 114 is made from polypropylene.

In order to introduce fluid into rinsing member 114, supply tubes 150 and 151 are coupled to plumbing connections 148 with a flare fit using retaining clamp 158. Retaining clamp 158 includes plumbing apertures 160, each having a small end 162 and a large end 164. The large end 164 fits over the plumbing connections 148, while the small end 162 accommodates the supply tubes 150 and 151. Fastening aperture 166 desirably includes female threads to allow retaining clamp 158 to be securely fastened against side 44 of top spacer element portion 34 via aperture 54 with good clamping action against the plumbing connections 148. Contour 168 provides room for the fastening hardware 167 used for this. Coupling devices 154 and 155 at the top of supply tubes 150 and 151 allow the supply tubes 150 and 151 to be connected to upstream plumbing, not shown.

DI water is a suitable rinsing liquid. The DI water may be chilled, supplied at ambient, or heated, as desired. Using DI water at ambient temperature (about 19 to 20° C.) has been found to be suitable.

The use of dual supply tubes 150 and 151 for supplying rinsing liquid to is a desirable option. Depending upon the desired rinsing action, one tube can be used to supply a relatively higher, more vigorous flow of rinsing liquid, while the other tube can be used to supply a lower, less vigorous flow of rinsing liquid. In some modes of practice, both flows can be introduced at the same time for an even greater flow. In one representative mode of practice, introducing DI water at a flow rate of five liters per minute through one of the tubes was found to be suitable for the higher flow rate, while introducing DI water at a flow rate of two liters per minute through the other tube was found to be suitable for the lower flow rate.

A suitable flow control methodology can be used to modulate the degree of flow through each tube. In some modes of practice, valves can be either set to be open or closed so that the flow through a particular supply tube is either on or off. This has the advantage of being very simple to implement. In such on or off methodologies, the use of two or more supply tubes as illustrated offers excellent control over rinsing flow rates. In other modes, flow can be regulated so that the amount of flow through one or more supply tubes can be adjusted at any level, or turned off, within a desired range. When practicing these kinds of methodologies, a single supply tube often would be sufficient to provide excellent control over the rinse flow introduced to rinsing member 114.

The rinsing member 114, as illustrated, also includes through apertures 144. These are provided as a manufacturing convenience to provide access for a drill bit to reach the other side of the member 114 for drilling the inlet ports providing fluid communication to the conduit 130 for the plumbing connections 148.

The assembled air intake assembly 10 is seen best in FIGS. 1-4, particularly in FIG. 3. These figures show how venturi pathways 172 are formed when the top member 12, base member 58, and rinsing member 114 are assembled. Each of pathways 172 includes a relatively narrow throat region 174 in which the pathway 172 is constricted and relatively broader, flaring ends 178 and 180. In use, flaring end 178 functions as an inlet through which one or more gases such as air, clean dry air, steam, nitrogen, carbon dioxide, argon, isopropyl alcohol vapor, combinations of these and the like can be drawn into air intake assembly 10. Flaring end 180 functions as an outlet through which one or more gases can be discharged downward into a processing chamber. The venturi-shaped passages 172 function as a containment system in situations in which treatment materials, which may be liquid, solid, or gas, are desirably contained in a chamber that requires an opening for the introduction of processing gases. In actual practice, generally the throat regions 174 of the pathways 172 tend to be containment boundaries below which fluid materials are contained in an underlying process chamber when gas flows through the pathways 172 into the process chamber.

For example, during a typical process, make-up air or other gas might be caused to enter a process chamber through the venturi-shaped pathways 172. The incoming air or gas accelerates as it passes through the throat regions 174 of the pathways 172. The relatively higher velocity air or gas moving through the throat regions 174 and into the chamber substantially prevents mist or other processing liquids from escaping back up air intake assembly 10. In contrast, in an air intake passage lacking a throat constriction or sufficient height, process chamber mist can escape, causing concerns such as contamination, reduced process performance due to loss of processing material, and the like.

In one illustrative operation condition, substantially complete mist and steam containment is achieved using 50 cfm inlet air. This is achieved using 3 inches of exhaust vacuum. In this test, the workpiece is spun on its chuck at 250 rpm while being sprayed with 1 liter per minute deionized water at 65° C. In this illustrative example, the width of each of the venturi throats is 1.067 inches, while each corresponding inlet and outlet has a width of 1.44 inches. The length of each of the venturi-shaped passages is three inches.

FIG. 3 shows best how a rinsing member 114 can be clamped in rabbets 30 and 52 between top member 12 and base member 58 in the assembly 10. FIG. 3 also shows how the rinsing member 114 is positioned at the boundary between the top member 12 and the base member 58. This allows rinsing liquid to be dispensed proximal to this boundary so that substantially the entire hydrophilic surfaces of base member 58 forming the venturi pathways 172 are exposed to an extremely effective rinsing action. Additionally, the nozzles are preferably in close proximity to the surfaces being wetted so that the rinsing fluid can be flowingly dispensed onto these surfaces while minimizing splashing or drops that could lead to workpiece contamination. Advantageously in preferred embodiments, the nozzles are generally inclined toward the surfaces being wetted, have a diverging configuration, such as described above, and are desirably positioned very close to the target surface, often being 0.1 mm to 20 mm, more desirably 0.1 mm to 5 mm, and even 1 mm from the target surface. This configuration promotes a smooth delivery of the fluid onto the surfaces being wetted. The dispensing conditions are selected so that splashing and atomization are substantially avoided as much as is practical as the fluid flow comes into contact with the target surfaces. In more desired dispensing conditions, the dispensed streams are poured onto the target surfaces so that the streams flowingly spread out upon reaching the target surfaces. The rinsing fluid can be supplied under pressure to control fluid flow to the target surfaces, or gravity can merely facilitate dispensing (i.e. pouring), which supply can be determined differently based upon process chamber geometries and conditions. Spreading of the fluid helps the streams wet as much of the surfaces as possible, e.g., wetting of the entire surface is most desirable. The nozzle pattern is selected to provide minimal overlap, if any, of adjacent streams as this spreading out occurs. Wetting of the full surface via the diverging flows is desirably achieved by the time the flows reach the throat regions 174 of the venture-shaped pathways 172. Achieving full surface coverage at this stage helps promote a further, smooth, sheeting flow of liquid onto and across the lower surface of the barrier structure fluidly coupled to the venturi surfaces. Gas flow accelerating through throat regions 174 further promotes spreading and thinning of the liquid flow on the lower surface of the barrier structure.

When dispensing water onto the hydrophilic surfaces of the venturi pathway walls, excellent sheeting action and coverage of the hydrophilic surfaces is observed with very little splashing or droplet formation. As the rinsing liquid moves out of the venturi pathway onto the adjacent, hydrophilic lower surface of the barrier plate, the sheets of flowing rinsing liquid smoothly and uniformly sheet over and cover the lower, hydrophilic surface of the barrier plate. As the rinsing liquid flows outward toward the outer periphery of the barrier plate, aspiration techniques can be used to collect at least some of the rinse liquid as described in Assignee's Co-Pending Application No. 3. Aspiration may occur while rinsing and/or at the end of rinsing.

As an additional advantage, FIG. 3 shows how the rinsing liquid is introduced onto the surfaces defining venturi pathways 172 above the throat regions 174. By introducing liquid from nozzles positioned higher up in the pathways 172 like this, and by being positioned close to the walls of the pathways 172, the nozzle structures have a de minimis impact upon fluid flow moving through the pathways 172. If the nozzle structures happen to capture moisture, drips tend to flow down the surfaces rather than fall downward into the chamber where contamination of workpieces otherwise might be a greater risk.

Being positioned above the throat regions 174, the nozzle structures are outside the containment boundary provided by the venturi pathways. This helps to protect the nozzle structures from contamination. This also allows the rinse to reach all surfaces likely to bear residual chemicals. As an additional advantage, it is easier to develop and implement a diverging fluid flow that achieves excellent surface wetting. If the nozzles were to be positioned below the throat regions 174, the angles incorporated into the diverging nozzle pattern would be more critical and subject to stricter tolerances in order to be effective.

All in all, these numerous features and benefits associated with the rinsing member 114 and nozzle arrays 136 and 140 integrated into the rinsing member provide rinsing methodologies with dramatically reduced particle contamination as compared to a prior rinsing practice. In illustrative modes of practice, for instance, the hydrophilic portions of the venturi pathways below the rinsing member 114 and the hydrophilic lower surface of the barrier plate are pre-wetted with rinsing liquid before introducing a workpiece. Because the rinse is flowingly distributed onto these surfaces, splashing and droplets that can lead to particle contamination are substantially avoided. Pre-wetting also helps to ensure that these hydrophilic surfaces have been rinsed thoroughly and are uniformly wetted. Prior to introducing a workpiece, the hydrophilic surfaces may be dried if desired, but it is often convenient and shortens cycle time to leave the surfaces wet. Because the wetted surfaces are hydrophilic, discrete droplets tend not to form on these surfaces, and a workpiece can be loaded, processed, and unloaded with de minimis, if any, contamination. Rinsing of the venturi pathways 172 and barrier plate thus may occur prior to a chemical treatment step. Rinsing also may occur between chemical processing steps and/or during these steps. The nozzles of the rinsing member 114 may be aspirated to suck back residual liquid at the end of a rinsing dispense to avoid drips.

Initial wetting of the hydrophilic surfaces generally requires more rinse liquid than maintaining the flow once established. Accordingly, rinse liquid delivery may be modulated to recognize this effect. For instance, after wetting is established, the rinse water can thereafter be introduced at a lesser flow. Flow may be reduced in a pulsed fashion, such as by opening and closing valves. The pulsing frequency and duration would be selected to maintain the desired flowrate profile while offering a lower overall consumption of rinsing liquid. Additionally, pulsing the rinsing liquid on and off may better wet and wash the hydrophilic surfaces via the associated surges of each flow pulse.

Figure 17:
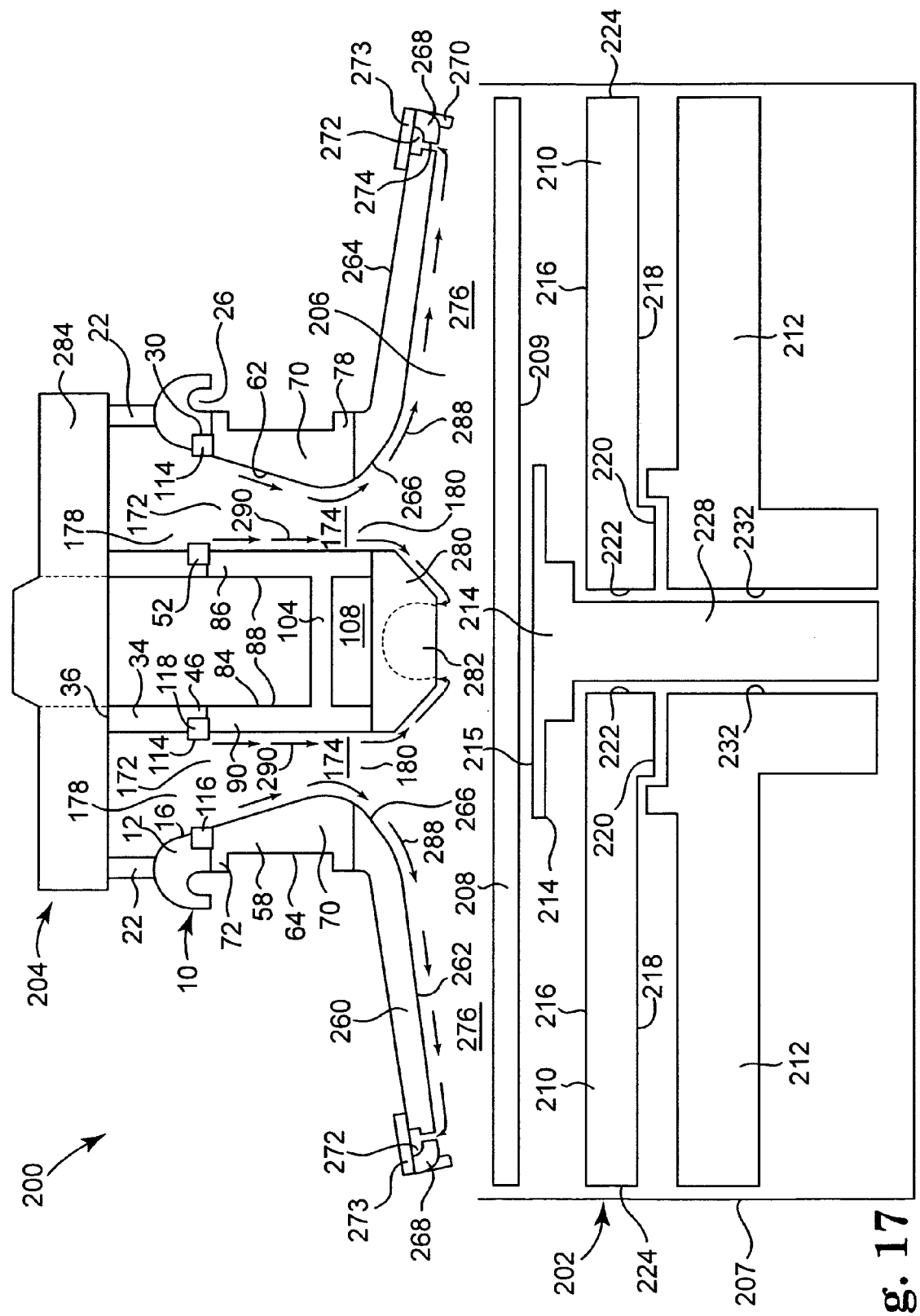
FIG. 17 is a schematic illustration of a tool that incorporates the air intake assembly of FIG. 1.

FIG. 17 schematically shows an illustrative tool 200 that incorporates air intake assembly 10 of FIGS. 1-16, and 18A-18I. For purposes of illustration, tool 200 is of the type in which a single workpiece 208 is housed in the tool 200 at any one time and subjected to one or more treatments in which liquid(s), gas(es), and/or other processing media are caused to contact the workpiece 208. In the microelectronics industry, for instance, tool 200 may be referred to as a single wafer processing tool. Workpiece 208 typically comprises a semiconductor wafer or other in-process microelectronic substrate.

Tool 200 generally includes as main assemblies a base section 202 and a barrier/dispense section 204. In actual use, the base section 202 and the barrier/dispense section 204 would be mounted to a framework (not shown) and enclosed within a housing (not shown) of tool 200. This mounting can occur in any manner such as via screws, bolts, rivets, adhesives, welds, clamps, brackets, combinations of these, or the like. Desirably, though, the sections 202 and 204 and/or components thereof are independently and removably mounted to facilitate service, maintenance, upgrade, and/or replacement.

Base section 202 and barrier/dispense section 204 help define processing chamber 206 in which workpiece 208 is positioned during processing. Base section 202 and/or barrier/dispense section 204 include one or more features or capabilities to allow workpiece 208 to be loaded into and taken from processing chamber 206. Such features and capabilities may include, for instance, a door that may be opened or closed to provide the desired egress. Alternatively, and as contemplated in preferred modes of practice, base section 202 and barrier/dispense section 204 are moveable relative to each other to provide this egress. Conveniently, this relative movement occurs by raising and lowering barrier dispense section 204 while keeping base section 202 fixed to the surrounding framework (not shown).

Base section 202 generally includes a housing 207, chuck 210, motor 212, and backside dispense head 214. Inside processing chamber 206, workpiece 208 is supported and held by chuck 210. Chuck 210 is desirably cylindrical in shape and includes an upper face 216, lower face 218, annular base 220, central through bore 222, and sidewall 224 at the outer periphery. Chuck 210 may be stationary or it may be rotatable about a central axis. For purposes of illustration, the figures illustrate an embodiment of tool 200 in which chuck 210 is rotatably driven by motor 212 so that workpiece 208 may be spun about an axis during processing. In those embodiments in which workpiece 208 is spun by a rotating chuck 210, the spinning helps to spread dispensed treatment materials uniformly over the workpiece 208. Motor 212 may be of the hollow shaft type and may be mounted to tool 200 by any convenient approach.

Chuck 210 may secure workpiece 208 in any of a variety of different ways in accordance with conventional practices now or hereafter developed. Preferably, chuck 210 includes edge gripping structures (not shown) that securely hold workpiece 208 above upper face 215 of optional dispense head 214 (discussed below) such that there is a gap between workpiece 208 and the upper face 215. This kind of positioning allows treatment chemicals, including rinse water, to be dispensed onto either the upper face or lower face of workpiece 208.

Optionally, tool 200 may include dispense structure(s) for treating the lower face 209 of workpiece 208. An illustrative backside dispense mechanism is shown as a generally circular dispense head 214 in which one or more treatment chemicals may be dispensed toward lower face of workpiece 208. Treatment chemicals are supplied to backside dispense head 214 via shaft 228 that passes through central bore 222 of chuck 210 and central bore 232 of motor 212. In embodiments in which chuck 210 rotates, there are gaps between shaft 228, and central bores 222 and 232 so that the parts do not contact as the chuck 210 rotates. The backside dispense head 214 may be coupled to one or more supplies (not shown) of treatment materials to be dispensed as supplied or blended on demand.

In particularly preferred embodiments, the base section 202 is in the form of the "processing section 11" described and illustrated in assignee's Co-Pending Applications Nos. 1 and 2. In other words, the barrier dispense section 204 of the present specification advantageously may be coupled to the "moveable member 526" and thereby substituted for the "dispense assembly 554" of Assignee's Co-Pending Applications Nos. 1 and 2.

A preferred embodiment of barrier/dispense section 204 generally includes the air intake assembly 10 centrally mounted onto the barrier plate 260. In this position, the venturi-shaped pathways 172 provide an egress into the process chamber 206. A preferred embodiment of barrier plate 260 is described as "barrier plate 102" in Assignee's Co-Pending Application No. 3.

Barrier plate 260 is generally annular shaped having a lower surface 262, and upper surface 264, and inner periphery 266, and an outer periphery 268. Inner periphery 266 is generally rounded and smoothly transitions into air intake assembly 10 to help promote smooth gas flow through the venturi-shaped pathways 172. Advantageously, lower surface 262 of barrier plate 260 includes one or more features that help to collect and remove liquid that may be present. As one strategy, aspiration features and techniques may be used for liquid removal as described in Assignee's Co-Pending Application No. 3, and this strategy is illustrated in FIG. 17. Annular rim 270 projects downward from lower surface 262 proximal to the outer periphery 268. Annular rim 270 helps to collect liquids on the lower surface 262 so that these liquids can be aspirated away. Aspiration of the collected liquid helps to dry the lower surface 262 and to prevent unwanted dripping from lower surface onto the underlying workpiece 208. Liquid can be aspirated by pulling a vacuum on channel 272, in which case liquid collected at rim 270 will be drawn into channel 272 through aspiration nozzles 274. Channel 272 is formed as a groove in the barrier plate 260 and is sealed by cover 273. Via z-axis movement of "moveable support member 526" according to Assignee's Co-pending Applications Nos. 1 and 2, the position of barrier plate 260 relative to the underlying workpiece 208 can be controlled.

Preferably, at least lower surface 262 of barrier plate 260 is angled downward in a radially outward direction relative to the underlying plane of workpiece 208 to establish a tapering flow channel 276 between workpiece 208 and lower surface 262 of barrier plate 260. The tapering configuration of channel 276 helps to promote radial flow outward from the center of workpiece 208 while minimizing recirculation zones. The tapering flow channel 276 also helps to smoothly converge and increase the velocity of flowing fluids approaching the outer edge of workpiece 208. This helps to reduce liquid splash effects. The angle of lower surface 262 also helps liquid on lower surface 262 to drain toward annular rim 270, where the collected liquid can be aspirated away rather than drip downward onto workpiece 208 or the apparatus (not shown) used to deliver or remove workpiece 208 from the process chamber 206. The tapering configuration also helps to reduce recirculation of particles back onto workpiece 208. The configuration also helps facilitate chemical reclaim efficiency by better containment of fluids.

Additionally with respect to this particular embodiment, the generally annular barrier plate 260 functions in one respect as a lid over processing chamber 206 in order to help provide a protected environment for workpiece treatment and to help contain dispensed materials in the processing chamber 206. However, the generally annular barrier plate 260 preferably does not seal processing chamber 206, but rather merely comes into close proximity with other barriers helping to define processing chamber 206.

The angled lower surface 262 can have a variety of geometries. For instance, the geometry can be one or more of linear (conical), parabolic, polynomial, or the like. For purposes of illustration, the lower surface 262 generally linearly converges toward workpiece 208 in a radially outward direction.

Barrier/dispense section 204 desirably includes one or more independent mechanisms for dispensing treatment materials into the processing chamber 206. For instance, the illustrative embodiment includes at least one, preferably at least two, and more preferably at least three different kinds of dispensing capabilities. As one capability, a dispensing structure is included that sprays one or more treatment fluids downward toward workpiece 208, generally across a radius of workpiece 208 so that full surface coverage is obtained via rotation of the workpiece 208 below the spray. In preferred embodiments, this capability is provided by a dispensing structure such as spray bar 280 mounted to barrier plate 260 and air intake assembly 10. A preferred embodiment of spray bar 280 and methods of incorporating such a spray bar into a barrier/dispense section are described in Assignee's Co-Pending Application No. 3 as "spray bar 178".

As another dispensing capability, a dispensing structure is included that dispenses treatment chemicals generally downward onto the center of the underlying workpiece 208. As workpiece 208 spins, the centrally dispensed materials are distributed over the workpiece surface. In preferred embodiments, this capability is provided by a central dispense nozzle assembly 282 mounted to the air intake assembly 10. A preferred embodiment of such a nozzle is described as "center dispense nozzle assembly 518" in Assignee's Co-Pending Application No. 3.

Additionally, showerhead dispense member 284 mounted and supported on the standoffs 22 and the top spacer element portion provides still yet another way to introduce processing materials, typically gases, vapors, and/or entrained materials into the processing chamber 206. A particularly preferred embodiment of a dispensing showerhead is described as "showerhead dispense member 426" in Assignee's Co-Pending Application No. 3.

The dispensing components of the barrier/dispense structure 204 may be coupled to one or more supplies (not shown) of treatment materials provided via supply lines (not shown). These materials can be dispensed as supplied or blended on demand. A wide variety of treatment materials may be used, as tool 200 is quite flexible in the types of treatments that may be carried out. Just a small sampling of representative treatment materials include gases and liquids such as nitrogen, carbon dioxide, clean dry air, steam, argon, HF gas, aqueous HF, aqueous isopropyl alcohol or other alcohols and/or tensioactive material(s), deionized water, aqueous or other solutions of ammonium hydroxide, aqueous or other solutions of sulfuric acid and/or its desiccating species and precursors (e.g. sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$)), aqueous or other solutions of nitric acid, aqueous or other solutions of phosphoric acid, aqueous or other solutions of hydrogen chloride, oxidizers such as hydrogen peroxide and/or ozone gas, aqueous ozone, surfactants, organic acids and solvents, chelating agents, oxygen scavengers, combinations of these and the like.

Representative examples of processes and chemistries suitably practiced in tool 200 include those described in U.S. Publication No. 2006-0219258-A1, the disclosure of which is fully incorporated herein by reference. Other representative examples of processes and chemistries suitably practiced in tool 200 include those described in U.S. Pat. No. 6,065,424 titled "ELECTROLESS DEPOSITION OF METAL FILMS WITH SPRAY PROCESSOR"; Assignee's co-pending U.S. application Ser. No. 11/825,508, filed Jul. 6, 2007, naming Jeff Butterbaugh as one of the inventors, and titled "LIQUID AEROSOL PARTICLE REMOVAL METHOD," claiming priority to provisional application 60/819,179, filed, Jul. 7, 2006; Assignee's co-pending U.S. Provisional Patent Application No. 60/930,720 filed in the names of Jeff Butterbaugh et al. on May 18, 2007, and being titled "PROCESS FOR TREATMENT OF SUBSTRATES WITH WATER VAPOR OR STEAM"; and U.S. Patent Publication No. 2006/0128133 titled "REAGENT ACTIVATOR FOR ELECTROLESS PLATING," which published on Jun. 15, 2006. Each of the disclosures of this patent and these applications and publications are fully incorporated herein by reference in their respective entireties for all purposes.

FIG. 17 schematically illustrates the rinsing action provided by air intake assembly 10. Rinsing liquid is flowingly dispensed from nozzle arrays 136 and 140. Rather than unduly splash and drip downward into the process chamber 206, the dispensed liquid streams flowingly spread out and coalesce into a flowing sheet of liquid most desirably with minimal overlap of the dispensed streams. The liquid sheets downward, uniformly wetting the walls of the venturi pathways 172 and the lower surface 262 of the barrier plate 260. When the rinsing liquid is water, and because of the hydrophilic character of the wetted surfaces, the liquid uniformly wets the surfaces without unduly splashing or dripping downward into the process chamber 206. The flow desirably is laminar. The flow of the rinsing liquid from the nozzles is shown schematically by the arrows 288 and 290. The arrows 288 show how liquid reaching the outer periphery of the barrier plate 260 is aspirated away. The arrows 290 show how liquid reaching the underside of the spray bar 280 also is aspirated away.

Embodiments of the present invention may incorporate a pre-wetting strategy that promotes very comprehensive wetting and smooth sheeting action of the lower barrier structure surface with less of formation of discreet channels, dripping, or other problems that could lead to contamination. According to this strategy, the lower surface of the barrier plate 260 and the surfaces of the venture pathways 172 are pre-wetted to ensure that as much of the surfaces are wetted before initiating the flowing dispense of rinsing liquid from rinsing member 114. This may be done with or without a workpiece 208 being present, but often is done in the absence of a workpiece 208. This pre-wetting may occur by dispensing rinsing liquid from the spray bar 280 in a manner that generates a sufficient mist to wet the surfaces. This might also occur by a vigorous dispense of rinsing liquid from rinsing member 114. Once the surfaces are pre-wetted, rinsing liquid can be flowingly dispensed from rinsing member 114 to establish a uniform, comprehensive, sheeting flow past throat region 174 and then over the barrier structure surface. When pre-wetting is not used, the risk of getting discrete channels of flowing rinse liquid over the surface increases.

The complete disclosures of the patents, patent documents, and publications cited herein are incorporated by reference in their entirety as if each were individually incorporated.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. An apparatus for processing at least one microelectronic workpiece, comprising:
    a) a process chamber including a workpiece support that is positioned within the processing chamber and onto which the at least one microelectronic workpiece can be positioned during a treatment;
    b) a barrier structure including a lower surface that overlies and at least partially covers a workpiece when provided for treatment, wherein the lower surface of the barrier structure includes a surface that angles toward the workpiece support in a radially outward direction;
    c) an additional surface that is fluidly coupled to the barrier structure such that liquid can flow from the additional surface to the angled surface of the lower surface of the barrier structure; and d) a plurality of nozzles aimed at and positioned sufficiently close to the additional surface so that a liquid can be flowingly dispensed onto said additional surface such that the liquid can form a sheet and wet the angled surface of the lower surface of the barrier structure.

2. The apparatus of claim 1, wherein the plurality of nozzles comprise at least two nonparallel nozzles.

3. The apparatus of claim 2, wherein said at least two nonparallel nozzles are nonplanar with respect to each other.

4. The apparatus of claim 2, wherein said at least two nonparallel nozzles are planar with respect to each other.

5. The apparatus of claim 1, wherein the nozzles are positioned sufficiently close to the additional surface such that the liquid can be dispensed onto said additional surface with substantially no splashing.

6. The apparatus of claim 1, wherein the nozzles are positioned sufficiently close to the additional surface such that the liquid can be dispensed onto said additional surface under laminar flow conditions.

7. The apparatus of claim 1, wherein the size of the nozzle orifices is variable.

8. The apparatus of claim 1, wherein the spacing between adjacent nozzles is variable.

9. An apparatus for processing at least one microelectronic workpiece, comprising:

a) a process chamber including a workpiece support that is positioned within the processing chamber and onto which the at least one microelectronic workpiece can be positioned during a treatment;

b) a barrier structure including a lower surface that overlies and at least partially covers a workpiece when provided for treatment, wherein the lower surface of the barrier structure includes a surface that angles toward the workpiece support in a radially outward direction;

c) a venturi-shaped pathway providing an egress into the process chamber, said pathway including a pathway surface that is fluidly coupled to the barrier structure such that liquid can flow from the pathway surface to the angled surface of the lower surface of the barrier structure; and d) at least one nozzle positioned in the pathway and aimed so that a liquid can be flowingly dispensed onto the pathway surface such that the liquid can form a sheet and wet the angled surface of the lower surface of the barrier structure.

10. The apparatus of claim 9, wherein the venturi-shaped pathway has a throat region and the at least one nozzle is positioned upstream from the throat region so that the liquid can be dispensed onto the pathway surface and flow along the pathway surface through the throat region.

* * * * *